United States Patent
Tsuboi et al.

(10) Patent No.: US 9,647,693 B2
(45) Date of Patent: May 9, 2017

(54) DATA PROCESSING APPARATUS

(71) Applicant: Renesas Electronics Corporation, Kawasaki-shi (JP)

(72) Inventors: Yukitoshi Tsuboi, Kawasaki (JP); Hideo Nagano, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 171 days.

(21) Appl. No.: 14/590,913

(22) Filed: Jan. 6, 2015

(65) Prior Publication Data
US 2015/0194984 A1    Jul. 9, 2015

(30) Foreign Application Priority Data

Jan. 8, 2014 (JP) ................. 2014-001426

(51) Int. Cl.
*H03M 13/00* (2006.01)
*H03M 13/29* (2006.01)
(Continued)

(52) U.S. Cl.
CPC ......... *H03M 13/29* (2013.01); *G06F 11/1012* (2013.01); *G06F 11/1052* (2013.01);
(Continued)

(58) Field of Classification Search
CPC .... H03M 13/29; H03M 13/095; H03M 13/13; H03M 13/19; H03M 13/6575;
(Continued)

(56) References Cited

U.S. PATENT DOCUMENTS 5,063,565 A    11/1991  Ohashi
8,732,550 B2    5/2014  Ohnuki et al.
(Continued)

FOREIGN PATENT DOCUMENTS

JP    01-175041 A    7/1989
JP    10-027139 A    1/1998
(Continued)

OTHER PUBLICATIONS

Extended European Search Report dated Jun. 5, 2015.
(Continued)

*Primary Examiner* — Sam Rizk
(74) *Attorney, Agent, or Firm* — McGinn IP Law Group, PLLC

(57) ABSTRACT

A data processing apparatus including a processor and a memory has a parity/ECC encoder circuit and a parity/ECC decoder circuit. The parity/ECC encoder circuit is disposed in a signal path for writing data to the memory, includes a parity generating circuit for generating a parity of a plurality of bits from data to be written, and writes the generated parity together with the data into the memory. The parity/ECC decoder circuit is disposed in a signal path for reading data from the memory and includes a parity check unit. The parity generating circuit is configured so that each of a plurality of bits configuring the data contributes to generation of a parity of at least two bits. Consequently, the parity check unit can detect a two-bit error at high speed.

20 Claims, 31 Drawing Sheets

(51) Int. Cl.
  *G06F 11/10* (2006.01)
  *H03M 13/09* (2006.01)
  *H03M 13/13* (2006.01)
  *H03M 13/19* (2006.01)
  *H03M 13/15* (2006.01)
  *H03M 13/37* (2006.01)

(52) U.S. Cl.
  CPC ......... *H03M 13/095* (2013.01); *H03M 13/13* (2013.01); *H03M 13/19* (2013.01); *H03M 13/6575* (2013.01); *H03M 13/1575* (2013.01); *H03M 13/3715* (2013.01)

(58) Field of Classification Search
  CPC .......... H03M 13/1575; H03M 13/3715; G06F 11/1012; G06F 11/1052
  See application file for complete search history.

(56) References Cited

U.S. PATENT DOCUMENTS

| | | |
|---|---|---|
| 8,775,899 B2 | 7/2014 | Kamoshida |
| 2011/0225475 A1* | 9/2011 | Kumar ................ G06F 11/1052 714/763 |
| 2013/0073921 A1* | 3/2013 | Kamoshida ............ H03M 13/11 714/758 |

FOREIGN PATENT DOCUMENTS

| | | |
|---|---|---|
| JP | 2011-257966 A | 12/2011 |
| JP | 2013-070122 A | 4/2013 |
| WO | WO 2008/152728 A1 | 12/2008 |

OTHER PUBLICATIONS

M. Y. Hsiao, "A Class of Optimal Minimum Odd-weight-column SEC-DEC Codes", IBM Journal of Research and Development, vol. 14, Issue 4, pp. 395-401 published by IBM, Jul. 1970.

European Communication Pursuant to Article 94(3) EPC dated Jun. 20, 2016.

* cited by examiner

| | d0 | d1 | d2 | d3 | d4 | d5 | d6 | d7 | d8 | d9 | d10 | d11 | d12 | d13 | d14 | d15 | d16 | d17 | d18 | d19 | d20 | d21 | d22 | d23 | d24 | d25 | d26 | d27 | d28 | d29 | d30 | d31 |
|---|---|---|---|---|---|---|---|---|---|---|---|---|---|---|---|---|---|---|---|---|---|---|---|---|---|---|---|---|---|---|---|---|
| X0  | 1 | | | | | | | | | | | | | | | | | | | | | | | | | | | | | | | |
| X1  | | 1 | | | | | | | | | | | | | | | | | | | | | | | | | | | | | | |
| X2  | | | 1 | | | | | | | | | | | | | | | | | | | | | | | | | | | | | |
| X3  | | | | 1 | | | | | | | | | | | | | | | | | | | | | | | | | | | | |
| X4  | | | | | 1 | | | | | | | | | | | | | | | | | | | | | | | | | | | |
| X5  | | | | | | 1 | | | | | | | | | | | | | | | | | | | | | | | | | | |
| X6  | | | | | | | 1 | | | | | | | | | | | | | | | | | | | | | | | | | |
| X7  | | | | | | | | 1 | | | | | | | | | | | | | | | | | | | | | | | | |
| X8  | | | | | | | | | 1 | | | | | | | | | | | | | | | | | | | | | | | |
| X9  | | | | | | | | | | 1 | | | | | | | | | | | | | | | | | | | | | | |
| X10 | | | | | | | | | | | 1 | | | | | | | | | | | | | | | | | | | | | |
| X11 | | | | | | | | | | | | 1 | | | | | | | | | | | | | | | | | | | | |
| X12 | | | | | | | | | | | | | 1 | | | | | | | | | | | | | | | | | | | |
| X13 | | | | | | | | | | | | | | 1 | | | | | | | | | | | | | | | | | | |
| X14 | | | | | | | | | | | | | | | 1 | | | | | | | | | | | | | | | | | |
| X15 | | | | | | | | | | | | | | | | 1 | | | | | | | | | | | | | | | | |
| X16 | | | | | | | | | | | | | | | | | 1 | | | | | | | | | | | | | | | |
| X17 | | | | | | | | | | | | | | | | | | 1 | | | | | | | | | | | | | | |
| X18 | | | | | | | | | | | | | | | | | | | 1 | | | | | | | | | | | | | |
| X19 | | | | | | | | | | | | | | | | | | | | 1 | | | | | | | | | | | | |
| X20 | | | | | | | | | | | | | | | | | | | | | 1 | | | | | | | | | | | |
| X21 | | | | | | | | | | | | | | | | | | | | | | 1 | | | | | | | | | | |
| X22 | | | | | | | | | | | | | | | | | | | | | | | 1 | | | | | | | | | |
| X23 | | | | | | | | | | | | | | | | | | | | | | | | 1 | | | | | | | | |
| X24 | | | | | | | | | | | | | | | | | | | | | | | | | 1 | | | | | | | |
| X25 | | | | | | | | | | | | | | | | | | | | | | | | | | 1 | | | | | | |
| X26 | | | | | | | | | | | | | | | | | | | | | | | | | | | 1 | | | | | |
| X27 | | | | | | | | | | | | | | | | | | | | | | | | | | | | 1 | | | | |
| X28 | | 1 | | | | | | | | | | | | | | | | | | | | | | | | | | | | | | |
| X29 | | | | | | | | | | | | | | | | | | | | | | | | | | | | | | 1 | | |
| X30 | | | | | | | | | | | | | | | | | | | | | | | | | | | | | | | 1 | |
| X31 | | | | | | | | | | | | | | | | | | | | | | | | | | | | 1 | | | | 1 |

FIRST GROUP: X0–X15
SECOND GROUP: X16–X30
THIRD GROUP: X31

| | E0 | E1 | E2 | E3 | E4 | E5 | E6 |
|---|---|---|---|---|---|---|---|
| X0 | 1 | | | | | | 1 |
| X1 | 1 | | | | 1 | | |
| X2 | 1 | | | | | | 1 |
| X3 | 1 | | | | | 1 | |
| X4 | | 1 | | | 1 | | |
| X5 | | 1 | | | | | 1 |
| X6 | | 1 | | | | | 1 |
| X7 | | 1 | | | | 1 | |
| X8 | | | 1 | | | 1 | |
| X9 | | | 1 | | | 1 | |
| X10 | | | 1 | | 1 | | |
| X11 | | | 1 | | 1 | | |
| X12 | 1 | | | 1 | | | |
| X13 | | | | 1 | | | 1 |
| X14 | | | | 1 | 1 | | |
| X15 | | | 1 | 1 | | | |
| X16 | 1 | | | | | | |
| X17 | 1 | | | | | | |
| X18 | | 1 | | | | | |
| X19 | | 1 | | | | | |
| X20 | | 1 | | | | | |
| X21 | | | 1 | | | | |
| X22 | | | 1 | | | | |
| X23 | | | | 1 | | | |
| X24 | | | | 1 | | | |
| X25 | | | | 1 | | | |
| X26 | | | | | 1 | | |
| X27 | | | | | 1 | | |
| X28 | | | | | | 1 | |
| X29 | | | | | | 1 | |
| X30 | | | | | | | 1 |
| X31 | | | | | | | |

FIRST GROUP: X0–X15
SECOND GROUP: X16–X30
THIRD GROUP: X31

| | d0 | d1 | d2 | d3 | d4 | d5 | d6 | d7 | d8 | d9 | d10 | d11 | d12 | d13 | d14 | d15 | d16 | d17 | d18 | d19 | d20 | d21 | d22 | d23 | d24 | d25 | d26 | d27 | d28 | d29 | d30 | d31 |
|---|---|---|---|---|---|---|---|---|---|---|---|---|---|---|---|---|---|---|---|---|---|---|---|---|---|---|---|---|---|---|---|---|
| X0 | 1 | | | | | | | | | | | | | | | | | | | | | | | | | | | | | | | |
| X1 | | 1 | | | | | | | | | | | | | | | | | | | | | | | | | | | | | | |
| X2 | | | 1 | | | | | | | | | | | | | | | | | | | | | | | | | | | | | |
| X3 | | | | 1 | | | | | | | | | | | | | | | | | | | | | | | | | | | | |
| X4 | | | | | 1 | | | | | | | | | | | | | | | | | | | | | | | | | | | |
| X5 | | | | | | 1 | | | | | | | | | | | | | | | | | | | | | | | | | | |
| X6 | | | | | | | 1 | | | | | | | | | | | | | | | | | | | | | | | | | |
| X7 | | | | | | | | 1 | | | | | | | | | | | | | | | | | | | | | | | | |
| X8 | | | | | | | | | 1 | | | | | | | | | | | | | | | | | | | | | | | |
| X9 | | | | | | | | | | 1 | | | | | | | | | | | | | | | | | | | | | | |
| X10 | | | | | | | | | | | 1 | | | | | | | | | | | | | | | | | | | | | |
| X11 | | | | | | | | | | | | 1 | | | | | | | | | | | | | | | | | | | | |
| X12 | | | | | | | | | | | | | 1 | | | | | | | | | | | | | | | | | | | |
| X13 | | | | | | | | | | | | | | 1 | | | | | | | | | | | | | | | | | | |
| X14 | | | | | | | | | | | | | | | 1 | | | | | | | | | | | 1 | | | | | | |
| X15 | | | | | | | | | | | | | | | | 1 | 1 | | | | | | | | | | 1 | | | | | |
| X16 | | 1 | | | | | | | | | | | | | 1 | | | | | | | | | 1 | | | | | | | | |
| X17 | | | | | | | 1 | | | | | | | | | | | | | | | | | | 1 | | | | | | | |
| X18 | | | | | | | | | | | | | 1 | | | | | | | | | | | | | | | | 1 | | | |
| X19 | | | | | | | | | | | | | | | | | | | 1 | | | | | | | | | | | 1 | | |
| X20 | | | | | | | | | | | | | | | | | | 1 | 1 | | | 1 | | | | | | | | | 1 | |
| X21 | | | | | | 1 | | | | | | | | | | | | | | | | | 1 | | | | 1 | | | | | |
| X22 | | | | | | | | | | | | | | | 1 | | | | | | | | | | | 1 | | | | | | |
| X23 | | | | | | | | | | | | | | | | | | | | | | | | | | | | 1 | | | | |
| X24 | | | | | | | | | | | | | | | | | | | | | | | | | | | | | | | | |

FIRST GROUP: X0-X15
SECOND GROUP: X16-X24

FIG. 16

|    | d0 | d1  | d2 | d3 | d4 | d5  | d6  | d7 | d8 | d9 | d10 | d11 | d12 | d13 | d14 | d15 | d16 | d17 | d18 | d19 | d20 | d21 | d22 | d23 | d24 | d25 | d26 | d27 | d28 | d29 | d30 | d31 |
|----|----|-----|----|----|----|-----|-----|----|----|----|-----|-----|-----|-----|-----|-----|-----|-----|-----|-----|-----|-----|-----|-----|-----|-----|-----|-----|-----|-----|-----|-----|
| E0 | X0 | X1  | X16| X3 | X4 | X1  | X16 | X4 |    | X7 | X8  | X9  | X6  | X8  | X0  |     | X7  |     | X10 | X9  | X3  |     | X13 |     | X14 |     | X15 |     |     | X12 | X13 | X14 |
| E1 |    |     |    |    | X4 |     |     |    | X6 |    | X8  |     |     |     |     | X17 |     | X9  |     |     |     | X12 |     | X11 |     |     |     | X15 | X12 | X13 |     |     |
| E2 |    | X2  |    | X3 |    |     |     |    |    | X7 |     | X9  |     | X8  |     |     | X18 |     | X10 | X9  |     | X11 | X12 | X13 |     | X2  | X15 | X15 | X5  | X19 | X13 |     |
| E3 |    |     |    |    |    | X5  |     |    |    |    | X8  |     |     |     |     | X7  | X18 |     |     |     | X3  | X11 | X12 | X13 | X14 |     | X15 |     | X5  | X19 | X19 | X14 |
| E4 |    | X2  |    |    | X23|     | X20 |    |    |    |     |     | X20 |     | X8  |     |     |     |     |     |     |     |     |     | X17 |     |     | X22 | X22 |     |     |     |
| E5 | X0 | X2  |    |    |    | X23 | X5  |    | X6 |    |     |     | X6  | X23 | X0  |     | X7  |     | X10 | X24 | X24 | X11 | X21 | X11 | X14 | X2  | X15 | X15 | X5  |     |     |     |
| E6 | 1  |     |    |    |    |     |     |    | 1  |    |     |     | 1   |     |     |     |     |     |     | 1   |     |     |     |     |     | 1   |     |     |     |     |     | 1   |

☐ Xn : FIRST GROUP (X0~X15)

▨ Xm : SECOND GROUP (X16~X24)

FIG. 17

|     | E0 | E1 | E2 | E3 | E4 | E5 | E6 |
|-----|----|----|----|----|----|----|----|
| X0  | 1  |    |    |    |    | 1  |    |
| X1  | 1  |    |    |    | 1  |    |    |
| X2  |    |    |    | 1  | 1  |    |    |
| X3  | 1  |    | 1  |    |    |    |    |
| X4  | 1  | 1  |    |    |    |    |    |
| X5  |    |    |    | 1  |    | 1  |    |
| X6  |    | 1  |    |    |    | 1  |    |
| X7  |    | 1  |    |    | 1  |    |    |
| X8  |    | 1  |    | 1  |    |    |    |
| X9  |    | 1  | 1  |    |    |    |    |
| X10 |    |    | 1  |    |    | 1  |    |
| X11 |    |    | 1  |    | 1  |    |    |
| X12 |    | 1  | 1  |    |    |    |    |
| X13 | 1  |    | 1  |    |    |    |    |
| X14 | 1  |    |    | 1  |    |    |    |
| X15 |    |    | 1  | 1  |    |    |    |
| X16 | 1  |    |    |    |    |    |    |
| X17 |    | 1  |    |    |    |    |    |
| X18 |    |    |    | 1  |    |    |    |
| X19 |    |    |    | 1  |    |    |    |
| X20 |    |    |    |    | 1  |    |    |
| X21 |    |    |    |    | 1  |    |    |
| X22 |    |    |    |    | 1  |    |    |
| X23 |    |    |    |    |    | 1  |    |
| X24 |    |    |    |    |    | 1  |    |

FIRST GROUP: X0–X15
SECOND GROUP: X16–X24

| | | E0 | E1 | E2 | E3 | E4 | E5 | E6 |
|---|---|---|---|---|---|---|---|---|
| FIRST GROUP | X0 | 1 | | | | | | 1 |
| | X1 | 1 | | | | 1 | | |
| | X2 | | | | 1 | | 1 | |
| | X3 | | 1 | | | | 1 | |
| | X4 | | 1 | | 1 | | | |
| | X5 | | | 1 | | | | 1 |
| | X6 | | | 1 | | | 1 | |
| | X7 | | | 1 | | 1 | | |
| | X8 | | | | 1 | | | 1 |
| | X9 | | | 1 | 1 | | | |
| SECOND GROUP | X10 | 1 | | | | | | |
| | X11 | 1 | | | | | | |
| | X12 | | 1 | | | | | |
| | X13 | | 1 | | | | | |
| | X14 | | | | | 1 | | |
| | X15 | | | | | 1 | | |
| | X16 | | | | | | 1 | |
| | X17 | | | | | | | 1 |
| | | +<br>d6<br>+<br>d19 | +<br>d7<br>+<br>d9 | +<br>d3<br>+<br>d27 | +<br>d2<br>+<br>d16 | +<br>d1<br>+<br>d23 | +<br>d20 | +<br>d4 |

|  | X6 | X7 | X8 | X9 | X10 | X11 |  |
|----|----|----|----|----|-----|-----|---|
| X0 | d0 | d1 | d2 | d3 | d4 | d5 | 6 |
| X1 | d6 | d7 | d8 | d9 | d10 | d11 | 6 |
| X2 | d12 | d13 |  | d14 | d15 | d16 | 5 |
| X3 | d17 | d18 | d19 |  | d20 | d21 | 5 |
| X4 | d22 | d23 | d24 | d25 |  | d26 | 5 |
| X5 | d27 | d28 | d29 | d30 | d31 |  | 5 |
|  | 6 | 6 | 5 | 5 | 5 | 5 |  |

|  | X6 | X7 | X8 | X9 | X10 | X11 | |
|---|---|---|---|---|---|---|---|
| X0 | d0 | d1 | d2 | d3 | d4 | d5 | 5 |
| X1 | d6 | d7 | d8 | d9 | d10 | d11 | 5 |
| X2 | d12 | d13 |  | d14 | d15 | d16 | 4 |
| X3 | d17 | d18 | d19 |  | d20 | d21 | 4 |
| X4 | d22 | d23 | d24 | d25 |  | d26 | 4 |
| X5 | d27 | d28 | d29 | d30 | d31 |  | 4 |
|  | 5 | 5 | 4 | 4 | 4 | 4 | |

DATA PROCESSING APPARATUS

CROSS-REFERENCE TO RELATED APPLICATIONS

The disclosure of Japanese Patent Application No. 2014-001426 filed on Jan. 8, 2014 including the specification, drawings and abstract is incorporated herein by reference in its entirety.

BACKGROUND

The present invention relates to a data processing apparatus and, more particularly, to a technique which can be suitably used for an MCU system requiring both high-speed operation and functional safety.

In some cases, an MCU (Micro Controller Unit) system is requested to satisfy both high-speed operation and functional safety. For example, in the field of automobile application, to realize automatic driving in an Advanced Driver Assistance System (ADAS), a determination MCU (brain chip) is used. The determination MCU is requested to satisfy both high-speed operation realizing extremely high-speed process and functional safety which guarantees safety in the whole system even in the case where a circuit operates due to a soft error or the like.

Such an MCU system is configured by combining a CPU (Central Processing Unit) capable of performing high-speed operation exceeding 1 GHz and a high-speed memory such as a TCM (Tightly Coupled Memory) which is tightly coupled to the CPU or a cache memory. For functional safety, a mechanism of detecting, in the case where a soft error occurs in the high-speed memory, occurrence of an error in the data which seems to be caused by the soft error, and correcting the error can be mounted.

Patent literature 1 discloses a cache memory device having a soft error correcting method which exerts a small influence on the performance of a processor performing a pipeline process. A parity bit and an error correction code (ECC) are added at the time of writing data into a data array, and a parity check is made at the time of reading. When a data error is detected, the pipeline is stalled, and an error correction is executed during the stall. Patent literature 2 discloses a method of correcting an error in a register file. The method has an error detecting step and an error correcting step. When an error is detected in the error detecting step, arithmetic processing is interrupted and the error correcting step is executed. Patent literature 3 discloses a single error detecting/correcting method, and patent literature 4 discloses an error correcting apparatus. In the case where a parity error is detected, error correction is made. Patent literature 5 discloses an error correcting circuit of a single error correction/double error detection method (SEC-DED) capable of correcting an error of even a large word size. Non-patent literature 1 describes a generator matrix and a check matrix of SEC-DEC intended to suppress circuit scale while assuring error correcting/detecting performance.

RELATED ART LITERATURE

Patent Literature

Patent Literature 1: Japanese Unexamined Patent Application Publication No. 2011-257966
Patent Literature 2: International Publication WO 2008/152728
Patent Literature 3: Japanese Unexamined Patent Application Publication No. Hei 1(1989)-175041
Patent Literature 4: Japanese Unexamined Patent Application Publication No. 2013-70122
Patent literature 5: Japanese Unexamined Patent Application Publication No. Hei 10(1998)-27139

Non-Patent Literature

Non-Patent Literature 1: M. Y. Hsiao, "A Class of Optimal Minimum Odd-weight-column SEC-DEC Codes", IBM Journal of Research and Development, Volume 14, Issue 4, published by IBM, July 1970

SUMMARY

The inventors of the present invention had examined the patent literatures 1 to 5 and the non-patent literature 1 and, as a result, found the following new problems.

An error correcting processing (ECC) circuit of a 1-bit error correcting/2-bit error detecting (SEC-DED) method often used in the above-described known arts and the like is a complicated circuit which is not suitable for high-speed operation or is realized by a pipeline of a multiple stages. Consequently, as described in the patent literatures 1 to 4, a technique is proposed in which at the time of writing data from a processor to a memory, the data is written by adding a parity in addition to an error correction code (ECC), a parity check is made at the time of reading and, only in the case where an error occurs, an error correcting process is performed. With the technique, in the case where no error occurs, it is sufficient to perform only a parity check which can realize high-speed operation. Since the frequency of actual occurrence of an error is not high, the frequency that a disturbance is caused in a pipeline stage by an error correcting process is suppressed.

A parity added to the error correction code (ECC) can detect an error of one bit. However, when there is an error of two bits, the parity makes erroneous determination (error determination) that there is no error. When an error correcting process of the 1-bit error correction/2-bit error detection (SEC-DED) method is performed only in the case where an error is detected in a parity check, occurrence of a 2-bit error cannot be detected. That is, there is a problem that in the case where a 2-bit error occurs, the occurrence is not detected by a check with a parity. To solve the problem, an error detecting process capable of detecting a 2-bit error has to be performed in place of a parity prior to the error correcting process. However, since the error correcting process itself is of the 1-bit error correction/2-bit error detection (SEC-DED) method, a mechanism of 2-bit error detection which precedes is realized by a circuit which is complicated as much as the error correcting process, so that the meaning of precedence is lost. Further, in the case of a general parity in a byte (eight bits) unit, exclusive OR of nine inputs which receive data of eight bits and a parity of one bit is necessary for a parity check. It was found that the technique is insufficient to address high-speed operation exceeding, for example, 1 GHz.

It is consequently found that, in an MCU system requested to perform high-speed operation exceeding 1 GHz, to execute error detection prior to the error correcting process of the 1-bit error correction/2-bit error detection (SEC-DED) method, a high-speed 2-bit error detecting circuit which can operate, for example, in one stage of a pipeline, that is, in one clock cycle is necessary.

Means for solving such problems will be described below. The other problems and novel features will become apparent from the description of the specification and the appended drawings.

An embodiment is as follows.

An embodiment relates to a data processing apparatus including a processor and a memory accessed from the processor and is configured as follows.

The apparatus includes a parity generating circuit disposed in a signal path for writing data of a plurality of bits from the processor to the memory and generating a parity of a plurality of bits from the data written, and a parity/ECC encoder circuit for writing the data and the generated parity into the memory. The apparatus is also provided with a parity/ECC decoder circuit disposed in a signal path for reading data from the memory to the processor and including a parity check unit.

The parity generating circuit is configured so that each of the bits configuring the data contributes to generation of a parity of at least two bits, and the parity check unit is configured so as to be able to detect presence/absence of an error of one bit or two bits in the data and the parity read from the memory.

An effect obtained by the embodiment will be briefly described as follows.

The present invention provides a 2-bit error detecting circuit which does not erroneously determine a 2-bit error as no error and can operate at speed higher than an error correcting process of a 1-bit error correction/2-bit error detection (SEC-DEC) method, and can execute error detection prior to the error correcting process of the SEC-DEC method.

BRIEF DESCRIPTION OF THE DRAWINGS

FIG. 3 illustrates a generator matrix (G) of an ECC realized by the ECC generating circuit 1.

FIG. 5 illustrates a generator matrix of a parity realized by the parity generating circuit 11.

FIG. 8 illustrates a check matrix (H) of an ECC in the ECC decoder circuit 3.

FIG. 10 illustrates a generator matrix of a parity realized by a parity generating circuit 54 according to the second embodiment.

FIG. 11 is an explanatory diagram illustrating the idea of a configuration of a generator matrix of the parity shown in FIG. 10.

FIG. 12 is an explanatory diagram of a state of generating an ECC using a parity based on the generator matrix of FIG. 10 as a partial sum.

FIG. 15 illustrates a generator matrix of a parity realized by a parity generating circuit 14 according to the third embodiment.

FIG. 16 is an explanatory diagram illustrating the idea of another configuration of a generator matrix of the parity shown in FIG. 15.

FIG. 17 is an explanatory diagram of a state of generating an ECC using a parity based on the generator matrix of FIG. 15 as a partial sum.

FIG. 22 illustrates another example of a generator matrix of a parity which can be used in each of the embodiments.

FIG. 24 illustrates further another example of the generator matrix of the parity which can be used in each of the embodiments.

FIG. 25 illustrates further another example of the generator matrix of the parity which can be used in each of the embodiments.

FIG. 27 is an explanatory diagram of a state of generating an ECC using a parity based on the generator matrix of FIG. 25, as a partial sum.

FIG. 28 illustrates a generator matrix of a parity in which the number of kinds of parities is minimized, which can be used in each of the embodiments.

FIG. 29 is an explanatory diagram illustrating the idea of a configuration of a generator matrix of the parity shown in FIG. 28.

FIG. 30 illustrates a generator matrix of another parity, in which the number of kinds of parities is minimized, which can be used in each of the embodiments.

FIG. 31 is an explanatory diagram illustrating the idea of a configuration of a generator matrix of the parity shown in FIG. 30.

DETAILED DESCRIPTION

1. Outline of Embodiments

Figure 1:
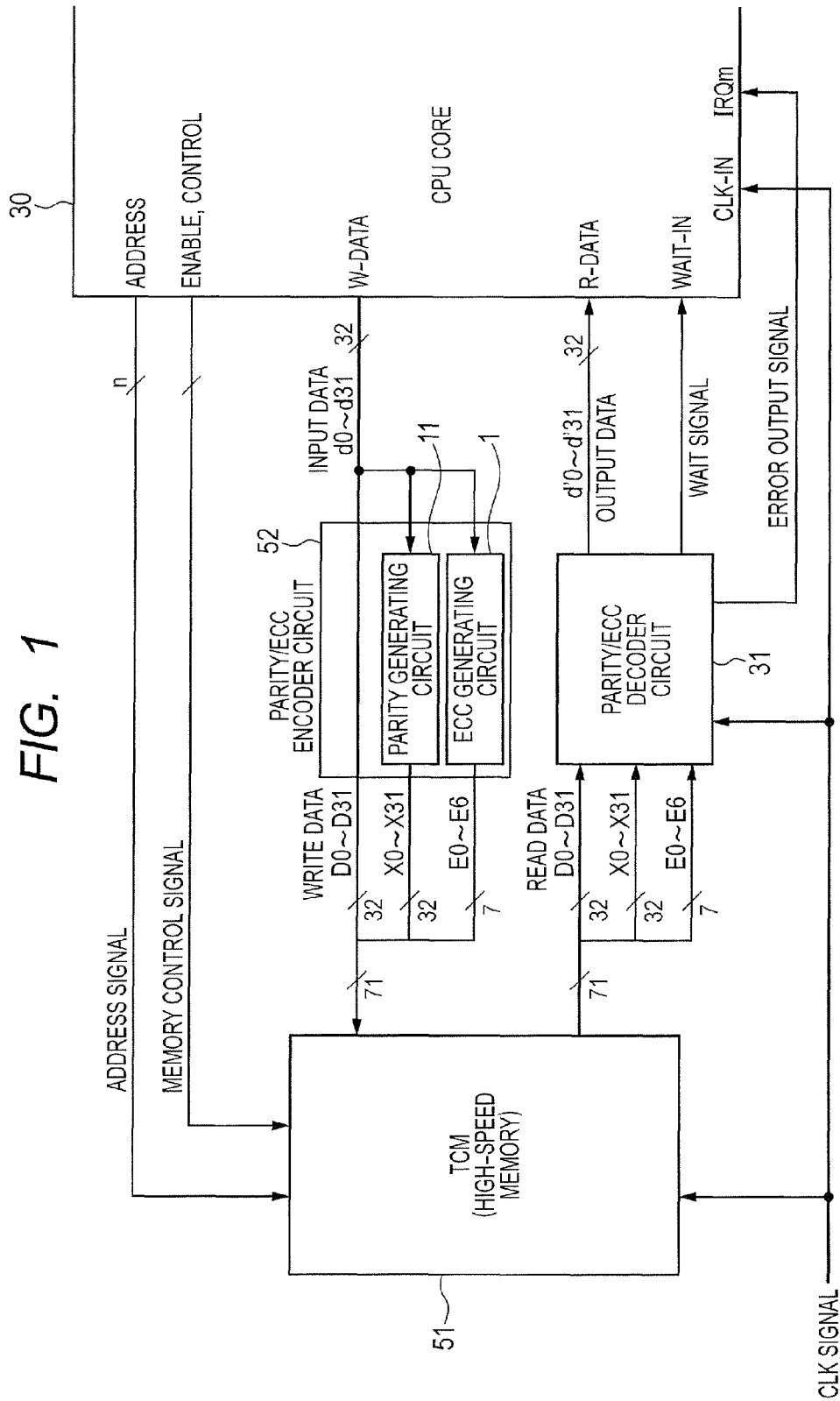
FIG. 1 is a block diagram illustrating a configuration example of a data processing apparatus 100 according to a first embodiment.

First, the outline of representative embodiments disclosed in the application will be described. A reference numeral in a drawing referred to in parenthesis in the description of the outline of the representative embodiments merely illustrates a matter included in the concept of the component to which the reference numeral is designated.

[1] Addition of Parity in which 2-Bit Error can be Detected

A data processing apparatus (100, 90) according to a representative embodiment disclosed in the present application includes a processor (30) and a memory (51, 29a, 29b) and is configured as follows. The data processing apparatus has a parity/ECC encoder circuit (13, 38*e*, 52, 53) disposed in a signal path for writing write data of a plurality of bits from the processor to the memory and including a parity generating circuit (11, 14, 20, 37*e*, 54). The data processing apparatus further has a parity/ECC decoder circuit (22, 31, 38*d*) disposed in a signal path for reading read data from the memory to the processor and including a parity check unit (23, 37*d*, 48).

The parity generating circuit generates a parity of a plurality of bits from the write data, and writes the parity with the write data into the memory, and each of the bits configuring the write data is configured to contribute to generation of a parity of at least two bits in the parity of the bits.

The parity check unit is configured so as to be able to detect presence/absence of an error of one bit or two bits in the read data and the parity of the bits read from the memory.

With the configuration, a 2-bit error detecting circuit capable of operating at speed higher than an error correction in order to execute error detection prior to an error correction of a 1-bit error correction/2-bit error detection (SEC-DEC) method. The error correction may be provided with a capability of correcting a 2-bit error.

[2] Wait Signal to CPU Core

In Item 1, the parity/ECC encoder circuit has an ECC generating circuit (1, 15, 55) adding an error correction code capable of correcting an error of one bit to the write data, and the parity/ECC decoder circuit has an error correcting unit (3 to 6, 41, 42) as an ECC decoder circuit executing an error correcting process of correcting an error in the read data on the basis of the read data and an error correction code corresponding to the read data.

The parity/ECC decoder circuit is configured, when the presence of an error is detected by the parity check unit, so as to be able to supply a wait signal to make the processor wait for reception of the read data until the error correcting process is completed.

With the configuration, the overhead for the error correcting process can be generated only when there is an error.

[3] Stall of Pipeline by Wait Signal

In Item 2, the processor stalls a pipeline operation on the basis of the wait signal.

Consequently, the operation of the processor can be safely stopped.

[4] Parallel Process of Error Detection and Error Correction

In Item 2, a process of detecting the presence/absence of an error by the parity check unit and the error correcting process by the error correcting unit are executed in parallel.

With the configuration, the overhead for the error correcting process can be minimized.

[5] Error Uncorrectable (Error Output)

In Item 2, the error correcting unit is configured so as to be able to determine whether the number of bits of an error in the read data is one bit or two bits, when the number of bits of the error is one bit, executes the error correcting process and, when the number of bits of the error is two bits, notifies of the processor of the fact that error correction is impossible.

With the configuration, the processor can detect occurrence of an error exceeding error correction capability (one bit) in the memory and execute a proper exception process.

[6] Error Correction Incapability Interrupt

In Item 5, the notification of the fact that the error correction is impossible is an interrupt request to the processor.

With the configuration, when occurrence of an error exceeding error correction capability (one bit) is detected, the processor can execute a proper interrupting process.

[7] Increase in Speed of Parity Check (Parity Generation from Data of Smaller Number of Bits)

In Item 1, the parity generating circuit generates each of parities of the bits by two bits or three bits configuring the write data.

With the configuration, the parity check unit can detect the presence/absence of an error at high speed.

[8] Increase in Speed of Parity Check (One Stage of XOR)

In Item 7, the parity generating circuit includes an exclusive OR gate (12*a* to 12*z*, 12A to 12F, and the like) generating each parity of the bits from two bits or three bits configuring the write data.

With the configuration, the parity check unit is configured by including 3-4 input exclusive OR circuits in parallel and can detect the presence/absence of an error at high speed.

[9] Sharing of Partial Sum Generating Circuit in Error Detection and Error Correction In Item 1, the parity/ECC encoder circuit has an ECC generating circuit (1, 15, 55) adding an error correction code capable of correcting an error of one bit to the write data, and the parity/ECC decoder circuit has an error correcting unit (3 to 6, 41, 42) executing an error correcting process of correcting an error in the read data on the basis of the read data and an error correction code corresponding to the read data.

The ECC generating circuit is configured to be able to generate the error correction code by using a parity of a plurality of bits generated by the parity generating circuit from the write data to be written in the memory as a partial sum.

With the configuration, a circuit as a part of the ECC generating circuit is commonly used as a parity generating circuit, so that the scale of necessary circuits is saved.

[10] Storage of Data and Parity In Two Physically Different Memories

In Item 1, the memory includes a first memory (29*a*) into which the write data is written and a second memory (29*b*) into which the parity is written.

With the configuration, the probability of occurrence of a soft error at the same time in data and a parity corresponding to the data can be regarded as substantially zero.

[11] Addition of Parity Capable of Detecting 2-Bit Error

A data processing apparatus (100, 90) according to a representative embodiment disclosed in the present application has a processor (30) and a memory (51, 29*a*, 29*b*) and is configured as follows. The data processing apparatus includes: a parity generating circuit (11, 14, 20, 37*e*, 54) disposed in a signal path for writing write data of a plurality of bits from the processor to the memory; and a parity check unit (23, 37*d*, 48) disposed in a signal path for reading read data from the memory to the processor.

The parity generating circuit generates a parity of a plurality of bits from the write data and writes the parity together with the write data into the memory, and each of the bits configuring the write data is configured to contribute to generation of a parity of at least two bits in the parity of the bits.

The parity check unit is configured so as to be able to detect presence/absence of an error of one bit or two bits in the read data and the parity of the bits read from the memory.

With the configuration, a 2-bit error detecting circuit capable of operating at high speed can be provided.

[12] Cache

In Item 11, the data processing apparatus further includes a main storage device (39), and the memory is a cache memory (32) of reading data from the main storage device and temporarily storing the data.

The parity check unit is configured so as to be able to detect presence/absence of an error in the read data which is read from the cache memory and, in the case of presence of an error, reads data corresponding to the read data from the main storage device and rewrites it into the cache memory.

With the configuration, when a soft error occurs in the cache memory, data recovering means replacing error correction is provided.

[13] Instruction Cache

In Item 12, the main storage device is a nonvolatile memory (39).

With the configuration, as data recovering means replacing error correction in the case of occurrence of a soft error, an instruction code can be cached again from a nonvolatile memory by an instruction cache. Thus, the system with higher safety can be provided.

2. Details of Embodiments

Embodiments will be described more specifically.

First Embodiment

The configuration and operation of a data processing apparatus according to a first embodiment will be described with reference to the drawings.

FIG. 1 is a block diagram illustrating the configuration of a data processing apparatus according to a first embodiment. A data processing apparatus 100 according to the first embodiment includes a CPU core 30 as an example of a processor and a high-speed memory (TCM) 51 as an example of a memory and tightly coupled to the CPU core 30. In FIG. 1, an interface circuit of the CPU core 30 and the TCM 51 is illustrated. The CPU core 30 has, as a dedicated interface for accessing the TCM 51, an ADDRESS port, an ENABLE/CONTROL port, a W-DATA port, an R-DATA port, and a WAIT-IN port and further has a CLK-IN port to which a clock (CLK) signal is supplied and an IRQm port to which an interrupt request signal is supplied. From the CPU core 30 to the TCM 51, an address signal of n bits (n denotes a natural number) from the ADDRESS port and a memory control signal from the ENABLE/CONTROL port are supplied. The memory control signal is, for example, an enable signal which enables an access to the TCM 51 and an access type signal indicating either read or write. From the W-DATA port, data to be written from the CPU core 30 into the TCM 51 is output as input data d0 to d31 of 32 bits. To the R-DATA port, data read from the TCM 31 is supplied as output data d'0 to d'31 of 32 bits. In the case where a data access is not completed in one clock cycle, a WAIT signal is supplied to the WAIT-IN port.

Between the above-described dedicated interface of the CPU core 30 and the TCM 51, processing circuits (circuits related to ECC and parity) for adaptation to functional safety are provided. The TCM 51 includes for example, an SRAM (Static Random Access Memory) including (2^n) pieces of address spaces having data width of 71 bits. In a data line for writing data output from the W-DATA port of the CPU core 30 into the TCM 51, a parity/ECC encoder circuit 52 including a parity generating circuit 11 and an ECC generating circuit 1 is provided. The parity/ECC encoder circuit 52 generates parities X0 to X31 of 32 bits from the input data d0 to d31 by the parity generating circuit 11, generates ECCs E0 to E6 of seven bits from the input data d0 to d31 by the ECC generating circuit 1, and supplies the write data of total 71 bits together with the write data D0 to D31 to the TCM 51. In a data line for reading data from the TCM 51 to the R-DATA port of the CPU core 30, a parity/ECC decoder circuit 31 is provided. From the TCM 51, read data of total 71 bits made by the data D0 to D31 of 32 bits, the parities X0 to X31 of 32 bits, and ECCs E0 to E6 of seven bits is read and supplied to the parity/ECC decoder circuit 31. From the parity/ECC decoder circuit 31, output data d'0 to d'31 is output to the R-DATA port of the CPU core 30. The parity/ECC decoder circuit 31 outputs the wait signal and an error output signal to the WAIT-IN port and the IRQm port of the CPU core 30, respectively. Although not illustrated in FIG. 1, the parity/ECC decoder circuit 31 includes a parity check circuit corresponding to the parity generating circuit 11 and an error correcting circuit corresponding to the ECC generating circuit 1. A clock signal (CLK signal) is commonly supplied to the CPU core 30, the TCM 51, and the parity/ECC decoder circuit 31. The numbers of bits of signals illustrated are an example and can be properly changed.

The operation of the data processing apparatus 100 will be described. The CPU core 30 is a processor circuit of high-speed operation of sequentially executing an instruction every clock cycle of a CLK signal of high frequency (for example, exceeding 1 GHz) which is input. The CPU core 30 has an interface dedicated to a memory which can complete a data access of (reading or writing) in one clock cycle at the shortest and, in the data processing apparatus 100 of the first embodiment, the TCM (high-speed memory) 51 is coupled. When the CPU core 30 requests the TCM 51 for writing of the data d0 to d31, the parity/ECC encoder circuit 52 generates parities X0 to X31 and ECCs E0 to E6 from the input data d0 to d31 and writes them together with the write data D0 to D31 into the TCM 51. When the CPU core 30 requests for reading of the data d'0 to d'31 from the TCM 51, the parity/ECC decoder circuit 31 reads the read data D0 to D31 and the parities X0 to X31 and the ECCs E0 to E6 stored in correspondence with the read data D0 to D31 from the TCM 51, and makes a parity check. An error correcting process is performed as necessary in accordance with a result of the parity check, and the output data d'0 to d'31 is output to the R-DATA port of the CPU core 30. In the case where the data access to the TCM 51 is not completed within one clock cycle for some reason, the wait signal is output from the parity/ECC decoder circuit 31 in the same clock cycle as that in which the address signal and the memory control signal are output from the side of the CPU core 30. When the wait signal is output, the CPU core 30 stalls the pipeline in the period in which the wait signal is asserted, and restarts the process from a negated clock cycle. Consequently, for example, when the wait signal is asserted only in one clock cycle during reading of data from the TCM 51, the CPU core 30 obtains read data from the TCM 51 in the following clock cycle, so that a process of data reading is performed in two clock cycles.

A concrete configuration example of the parity/ECC encoder circuit 52 will be described.

Figure 2:
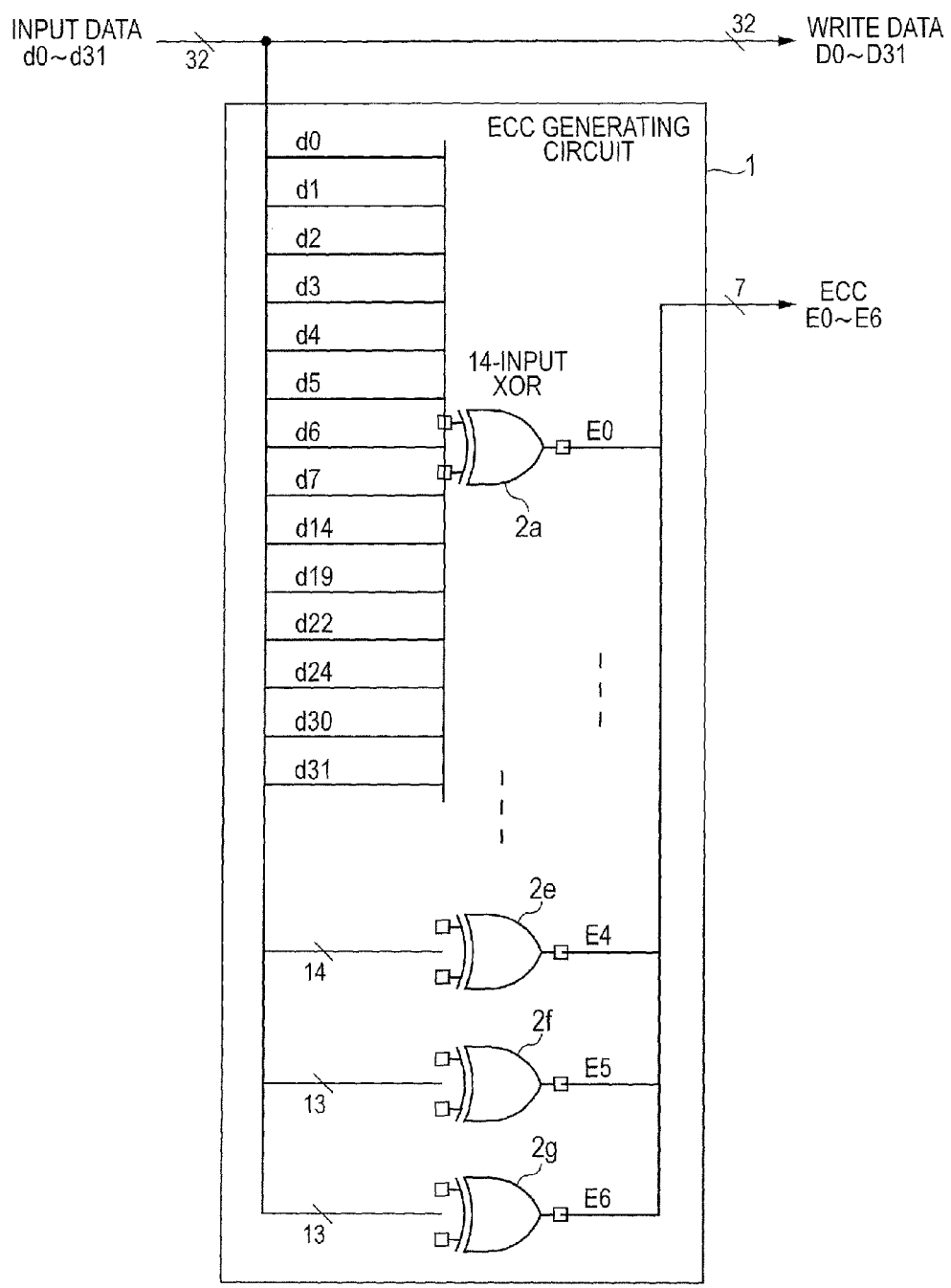
FIG. 2 is a block diagram expressing a configuration example of an ECC generating circuit 1.

FIG. 2 is a block diagram expressing a configuration example of the ECC generating circuit 1. The ECC generating circuit 1 is a circuit for generating error correction codes ECCs E0 to E6 as redundant bits of an error correction of a predetermined algorithm from the input data d0 to d31 in accordance with a generator matrix (G). The ECC generating circuit 1 is configured by using seven exclusive OR (XOR) circuits 2a to 2g. The circuits 2a to 2e are 14-input XOR circuits, and 2f and 2g are 13-input XOR circuits. FIG.

3 illustrates the generator matrix (G) of an ECC realized by the ECC generating circuit 1. It is an example of the generator matrix (G) which can realize 1-bit error correction/2-bit error detection by adding an ECC of seven bits to data of 32 bits, and is paired with a check matrix (H) (illustrated in FIG. 4 of the non-patent literature 1) of a (39, 32) SEC-DED code. Each column in the generator column corresponds to bits of input data, and each row corresponds to bits of an ECC to be generated. When matrix multiplication is performed using the input data d0 to d31 as a column vector, a column vector of the ECCs E0 to E6 is generated.

14 elements of "1" are included in each of the rows E0 to E4, 13 elements of "1" are included in each of the rows E5 and E6, and the element of "0" exists in the blank parts. Three elements of "1" are included in each of the columns d0 to d31. Since there are seven elements in each column, the element of "0" exists in the remaining four blanks. The generator matrix is configured by the idea of minimizing the number of "1" included as elements. 32 patterns are selected from 35 patterns in which three elements out of seven elements are "1" and four elements are "0" and allocated to each column. Unused patterns are three patterns of (1, 1, 1, 0, 0, 0, 0), (0, 0, 0, 1, 0, 1, 1), and (0, 0, 0, 0, 1, 1, 1).

The ECC generating circuit 1 is a circuit of generating each of bits of an ECC by exclusive OR (XOR) from input data of a plurality of bits corresponding to the element of "1" in the generator matrix so as to generate the ECCs E0 to E6 from the input data d0 to d31 in accordance with the generator matrix. Concretely, E0 to E4 are generated by the 14-input XOR circuits 2a to 2e, and the E5 and E6 are generated by the 13-input XOR circuits 2f and 2g, respectively. For example, taking a look at the row E0 as the head row of the generator matrix, it is understood that input data corresponding to the 14 columns including the element "1" is d0, d1, d2, d3, d4, d5, d6, d7, d14, d19, d22, d24, d30, and d31. In a form corresponding to it, those bits in the input data d0 to d31 are coupled to the input ports of the 14-input XOR circuit 2a which generates E0.

Figure 4:
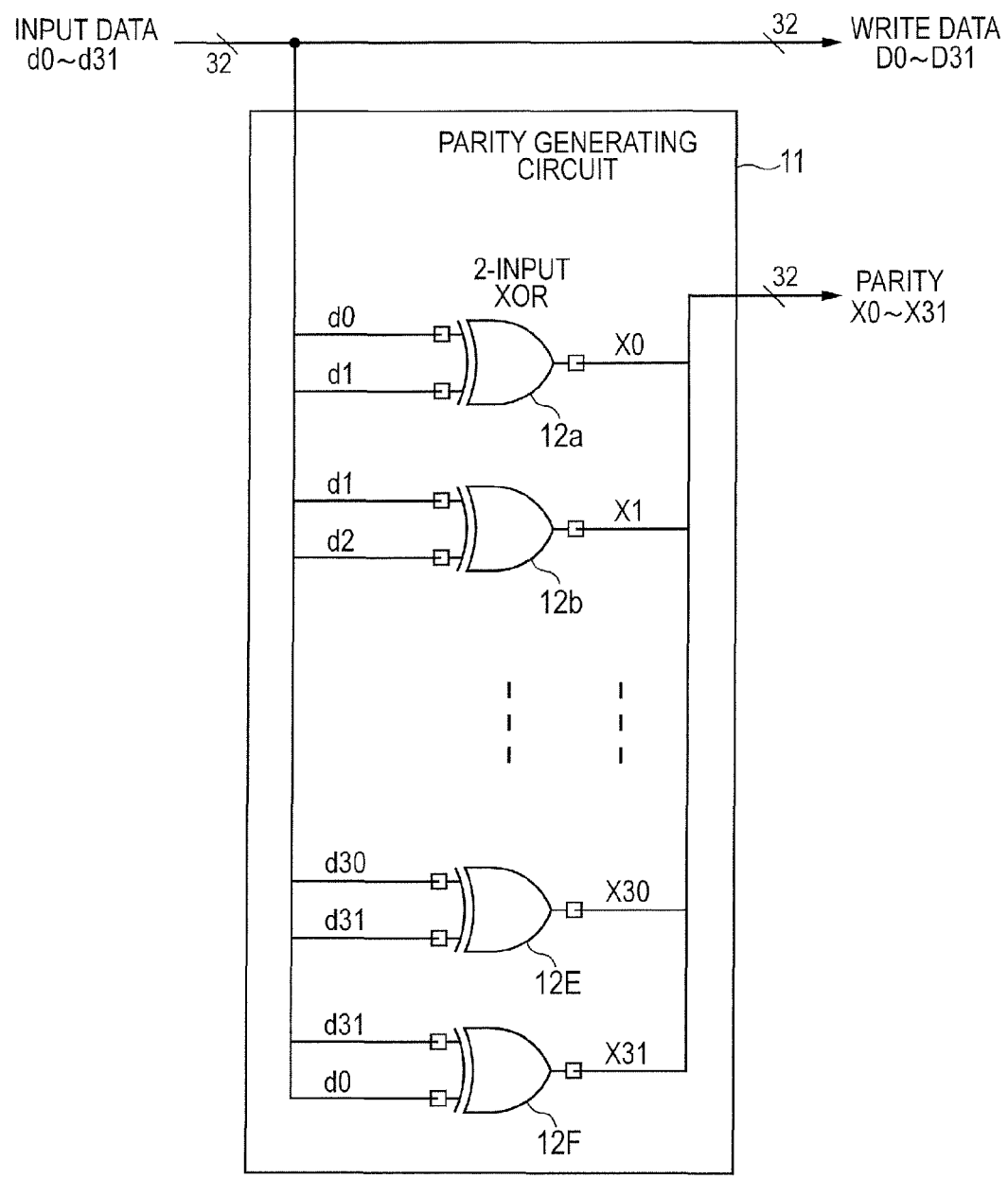
FIG. 4 is a block diagram expressing a configuration example of a parity generating circuit 11.
Figure 5:
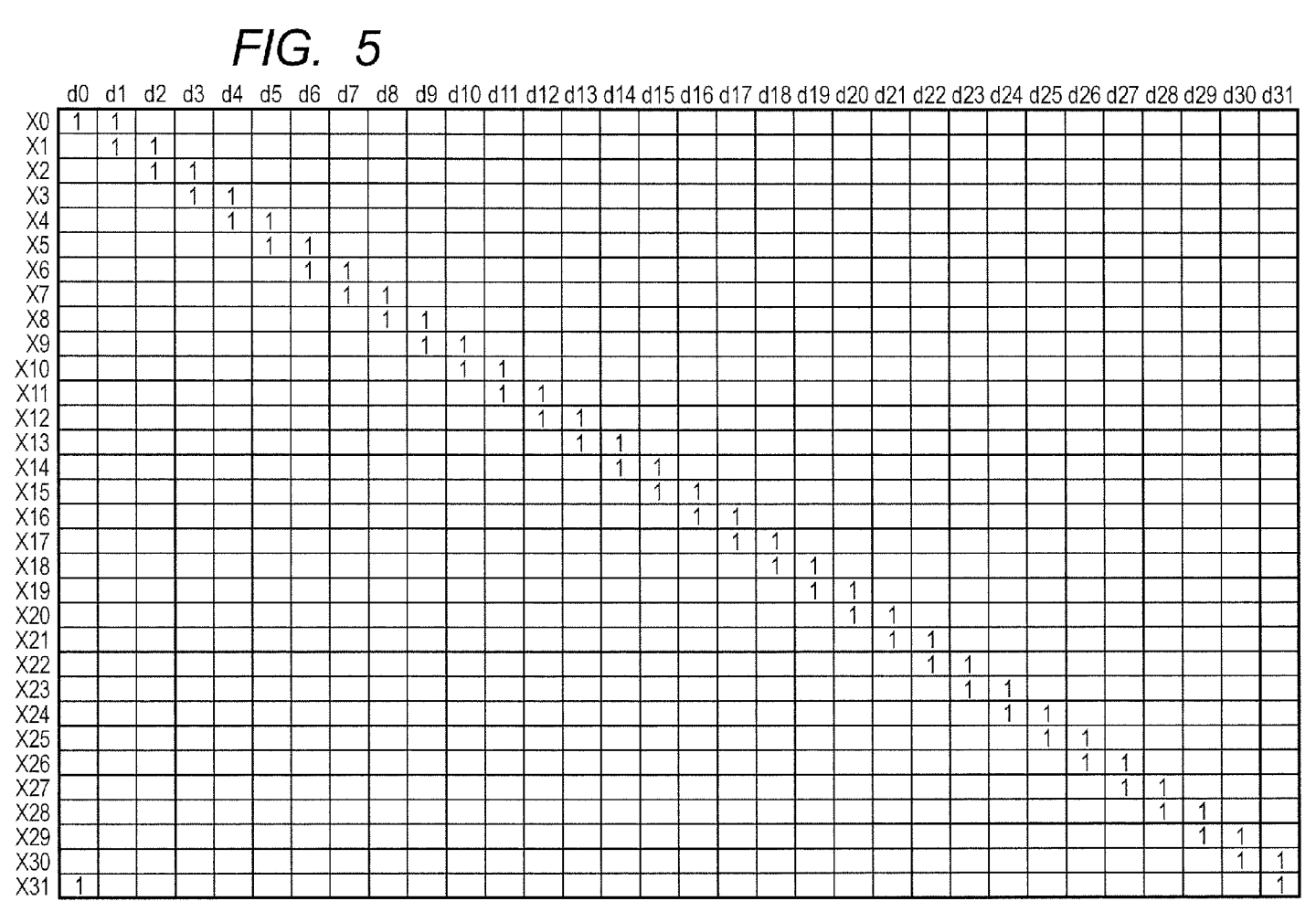

FIG. 4 is a block diagram expressing a configuration example of the parity generating circuit 11. The parity generating circuit 11 includes 32 2-input XOR circuits 12a to 12z and 12A to 12F. The parity generating circuit 11 is a circuit for generating 32 kinds of 1-bit parities X0 to X31 from the input data d0 to d31 of 32 bits. FIG. 5 illustrates a generator matrix of the 32 kinds of parities X0 to X31. It is an example of a generator matrix of generating a parity of one bit from data of two bits in 32 different combinations, that is, parities of total 32 bits. Each column in the generator matrix corresponds to a bit in input data, and each row corresponds to a bit in the 32 kinds of parities generated. When matrix multiplication is performed using the input data d0 to d31 as column vectors on the generator matrix, column vectors of the parities X0 to X31 are generated.

Two "1" elements are included in each of the rows X0 to X31 and the blank parts correspond to existence of the element "0". The generator matrix is configured in a regular, simple form so that two "1" elements are included in each of the columns d0 to d31.

The parity generating circuit 11 is a circuit for generating each of bits of parities by XOR operation from input data of two bits corresponding to the element "1" in the generator matrix to generate parities X0 to X31 from the input data d0 to d31 in accordance with the generator matrix and, concretely, generates X0 to X31 by the 2-input XOR circuits 12a to 12F, respectively. For example, taking a look at the row X31 as the last row of the generator matrix, it is understood that the input data corresponding to two columns including the element "1" is d31 and d0. In a form corresponding to it, two bits (d31 and d0) in the input data are coupled to the input ports of the 2-input XOR circuit 12F which generates X31.

A concrete configuration example of the parity/ECC decoder circuit 31 will be described.

Figure 6:
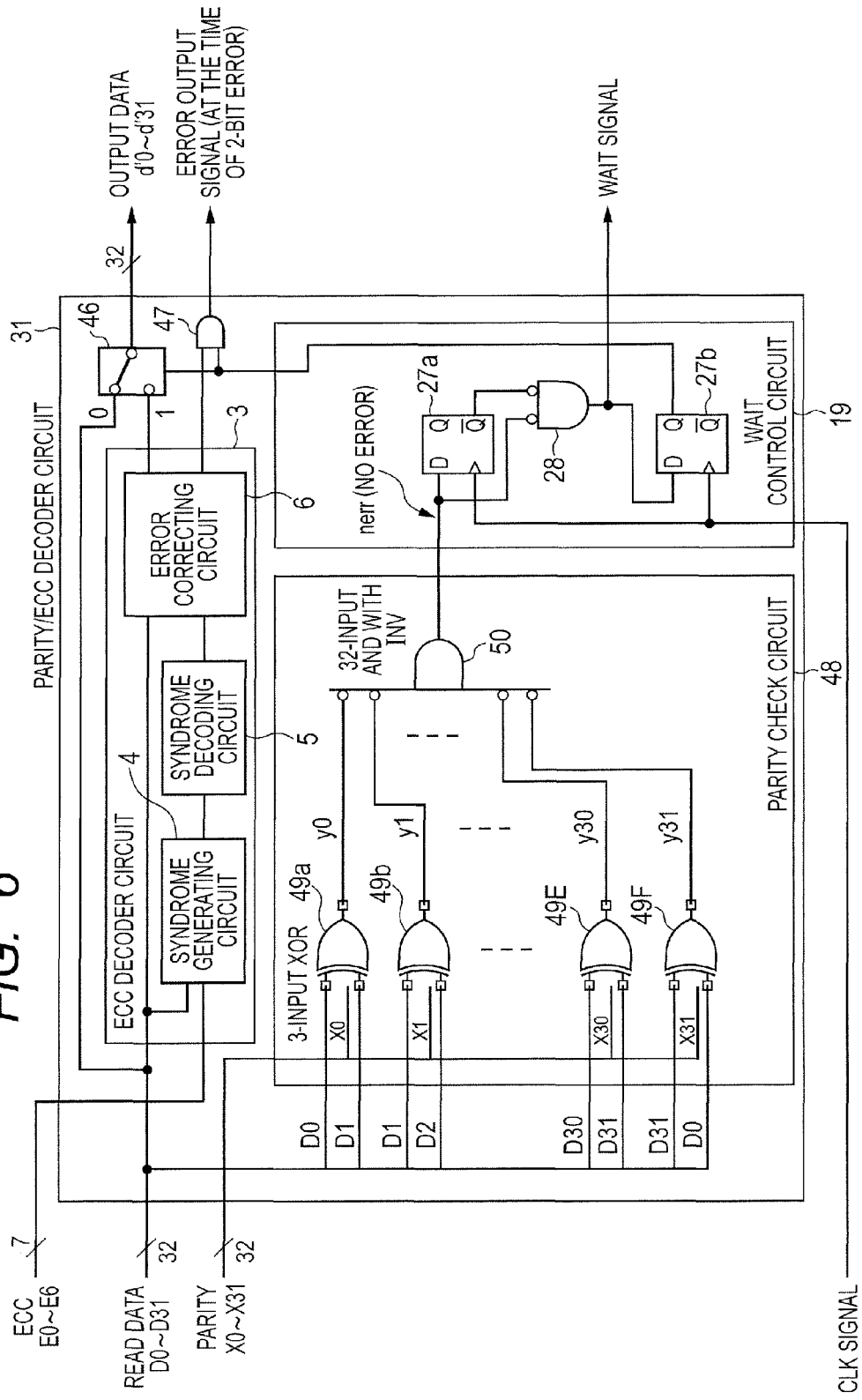
FIG. 6 is a block diagram expressing a configuration example of a parity/ECC decoder circuit 31.

FIG. 6 is a block diagram expressing a configuration example of the parity/ECC decoder circuit 31. The parity/ECC decoder circuit 31 includes an ECC decoder circuit 3, a parity check circuit 48, a wait control circuit 19, a data switching circuit 46, and an AND circuit 47. The parity/ECC decoder circuit 31 receives the read data D0 to D31 of 32 bits, ECCs E0 to E6, and parities X0 to X31 from the TCM 51 and outputs the output data d'0 to d'31 of 32 bits, a wait signal, and an error output signal to the CPU core 30. The ECCs E0 to E6 are error correction codes (ECCs) of seven bits corresponding to the read data D0 to D31. The parities X0 to X31 are parities of total 32 bits as 32 kinds of 1-bit parities corresponding to the read data D0 to D31. The parity/ECC decoder circuit 31 performs a process of 1-bit error correction/2-bit error detection on the read data D0 to D31 only in the case where it is necessary to generate output data d'0 to d'31 of 32 bits. The details of the error detecting and correcting process will be described later.

The parity check circuit 48 includes, for example, 32 pieces of 3-input XOR circuits 49a to 49z and 49A to 49F and an AND circuit 50 with 32 input inversions (INV) (AND circuits to which NOT (negative) logic is added to all of input ports). In a form corresponding to a check matrix (not illustrated) paired with the parity generator matrix illustrated in FIG. 5, 32 kinds of parity check results y0 to y31 are generated from the read data D0 to D31 and the parities X0 to X31, and an nerr (no error) signal which becomes "1" in the case where no bit error occurs in the read data D0 to D31 from all of the parity check results is generated.

The wait control circuit 19 includes flip-flop (register) circuits 27a and 27b and an AND circuit 28 with 2-input INV. The nerr (no error) signal is supplied to the flip-flop circuit 27a at the first stage, an inversion output (/Q) of the signal and the nerr (no error) signal are supplied to the AND circuit with 2-input INV, and a wait signal is generated. The wait signal is supplied to the flip-flop circuit 27b at the second stage, and the data switching circuit 46 and the AND circuit 47 are controlled by an output (Q) of the flip-flop circuit 27b. The data switching circuit 46 outputs the data d'0 to d'31 corrected by the ECC decoder circuit 3 when the output (Q) of the flip-flop circuit 27b is "1" (high), and outputs the read data D0 to D31 read from the TCM 51 and bypassed the ECC decoder circuit 3 as the output data d'0 to d'31 of the parity/ECC decoder circuit 31 when the output (Q) is "0" (low). The AND circuit 47 outputs an error output signal which is output from the ECC decoder circuit as the error output signal of the parity/ECC decoder circuit 31 when the output (Q) of the flip-flop circuit 27b is "1" (high) and masks the error output signal when the output (Q) is "0" (low).

The ECC decoder circuit 3 includes a syndrome generating circuit 4, a syndrome decoding circuit 5, and an error correcting circuit 6. When it is detected that an 1-bit error is included in the read data D0 to D31 and the ECCs E0 to E6, the error correcting process is performed on the read data D0 to D31 by using the ECCs E0 to E6, and the output data d'0 to d'31 is output. When it is detected that a 2-bit error is included in the read data D0 to D31 and the ECCs E0 to E6, an error output signal is output. A detailed configuration example and operation of the ECC decoder circuit 3 will be described later. The parity/ECC decoder circuit 31 is a circuit of performing the 1-bit error correction/2-bit error detection only in the case where it becomes necessary from the read data D0 to D31 of 32 bits, the ECCs E0 to E6 of seven bits corresponding to the read data, and parities X0 to X31 of total 32 bits as 1-bit parities of 32 kinds and generating the output data d'0 to d'31 of 32 bits. The process of 1-bit error correction/2-bit error detection is performed by the ECC decoder circuit 3, and output data of the ECC decoder circuit 3 is output via the 2-system data switching circuit (for 32-bit data) 46. In the case where there is no error, the 2-system data switching circuit 46 selects the original read data itself and outputs it. Since correction of a 2-bit error cannot be made, in the case where such a 2-bit error is detected, an error output signal is output to the CPU core 30. In reality, the signal is masked so as to be output only in a proper case by the 2-input AND circuit 47, and the error output signal is coupled to the specific interrupt input port IRQm of the CPU core 30 (refer to FIG. 1).

Figure 7:
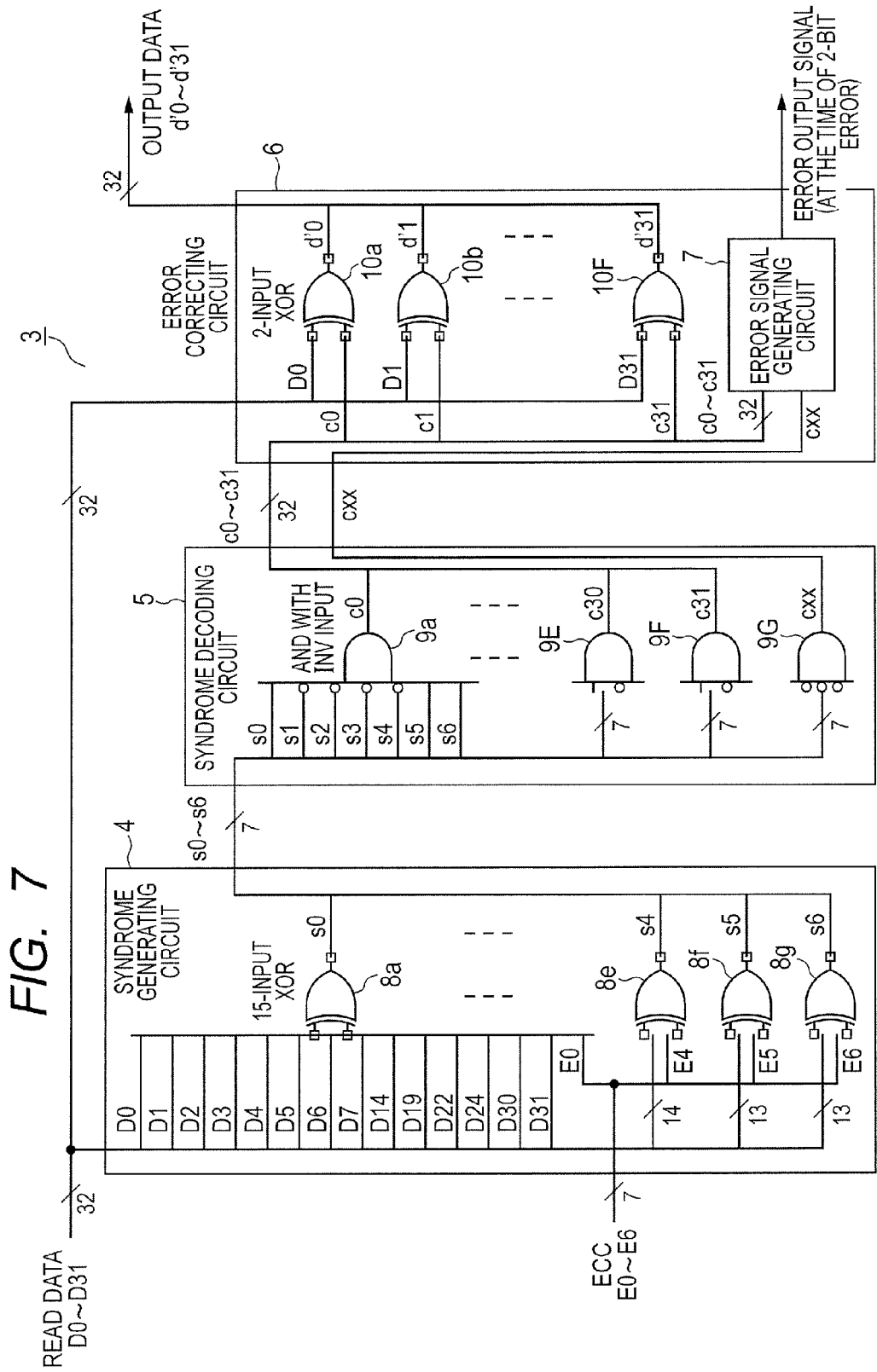
FIG. 7 is a block diagram expressing a more detailed configuration example of an ECC decoder circuit 3.

FIG. 7 is a block diagram illustrating the configuration of the ECC decoder circuit 3. The ECC decoder circuit 3 includes the syndrome generating circuit 4, the syndrome decoding circuit 5, the error correcting circuit 6, and an error signal generating circuit 7. The syndrome generating circuit 4 includes five 15-input XOR circuits 8*a* to 8*e* and two 14-input XOR circuits 8*f* and 8*g* and supplies syndrome codes s0 to s6 to the syndrome decoding circuit 5. The syndrome decoding circuit 5 includes 32 7-input partial-INV (NOT logic is added only to four input ports) AND circuits 9*a* to 9*z* and 9A to 9F, and a 7-input INV (NOT logic is added to all of the input ports) AND circuit 9G, and supplies 32 ways of error position flags c0 to c31 to the error correcting circuit 6. The error correcting circuit 6 includes 32 2-input XOR circuits 10*a* to 10*z* and 10A to 10F and the error signal generating circuit 7.

Figure 8:
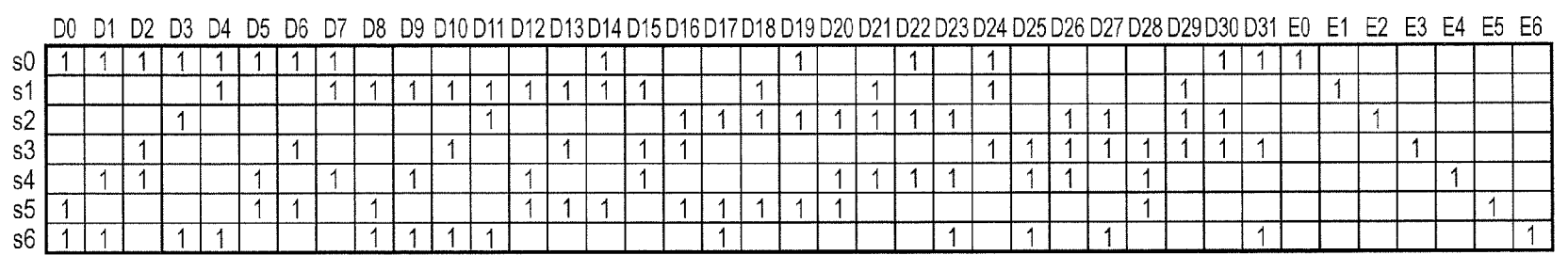

The syndrome generating circuit 4 in the first stage in the ECC decoder circuit 3 is a circuit of generating syndrome codes s0 to s6 from the read data D0 to D31 and the ECCs E0 to E6. FIG. 8 illustrates a check matrix of the ECCs. It shows a check matrix (H) (illustrated in FIG. 4 of the Non-Patent Literature 1) of a (39, 32) SEC-DED code for generating a syndrome code of seven bits from total 40 bits of data of 32 bits and ECCs of seven bits, and is paired with the ECC generator matrix (G) illustrated in FIG. 3. Each of columns of the check matrix corresponds to the read data and each bit in an ECC, and each of rows corresponds to bits of a syndrome code to be generated. By performing a matrix multiplication using the read data D0 to D31 and the ECCs E0 to E6 as column vectors on the check matrix, the column vectors of the syndrome codes s0 to s6 are generated.

Figure 3:
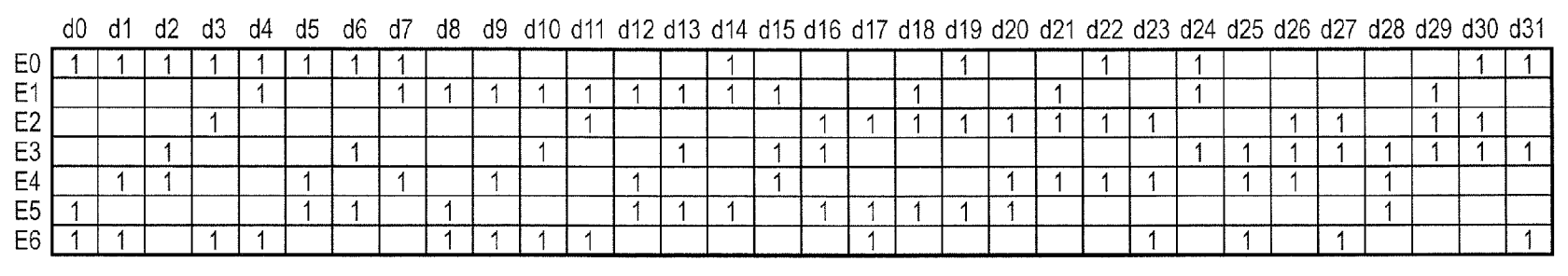

The arrangement of the elements from the column D0 to the column D31 in the check matrix of FIG. 8 is in the same pattern as that of the elements from the column d0 to the column d31 in the generator matrix of FIG. 3 as a pair. In the check matrix of FIG. 8, an identify matrix of seven rows and seven columns is added from the column E0 to the column E6 on the right side. Consequently, 15 "1" elements are included in each of the rows s0 to s4, and 14 "1" elements are included in each of the rows s5 and s6. The syndrome generating circuit 4 is a circuit of generating bits of a syndrome code by XOR operation from read data of a plurality of bits and the ECCs corresponding to the "1" elements in the check matrix to generate the syndrome codes s0 to s6 from the read data D0 to D31 and the ECCs E0 to E6 in accordance with the check matrix. Concretely, the syndrome generating circuit 4 generates s0 to s4 by the 15-input XOR circuits 8*a* to 8*e*, respectively, and generates s5 and s6 by the 14-input XOR circuits 8*f* and 8*g*, respectively.

The syndrome decoding circuit 5 is a circuit for checking a pattern of a column in the check matrix illustrated in FIG. 8 with which the syndrome codes s0 to s6 as outputs of the syndrome generating circuit 4 match. 32 ways of error position flags c0 to c31 are generated by 7-input AND circuits 9*a* to 9F with partial INV, respectively. For example, the pattern of the column D0 as the head column in the check matrix is (1, 0, 0, 0, 0, 1, 1). In a form corresponding to the pattern, in the syndrome decoding circuit 5, syndrome codes s1, s2, s3, and s4 are coupled to the four input ports with INV in the input ports of the 7-input AND circuit 9*a* with partial INV which generates the error position flag c0, and the syndrome codes s0, s5, and s6 are coupled to the remaining three input ports without INV. There is a case that only one of the error position flags c0 to c31 becomes "1", and it means that a 1-bit error occurs (that is, the value of the bit is inverted) in a corresponding position in the read data D0 to D31.

In addition, another no-error flag cxx is also generated by a 7-input AND circuit 9G with INV. It is used to check that all of the syndrome codes s0 to s6 are "0". In the case where no bit error occurs in the read data D0 to D31 and the ECCs E0 to E6, the no-error flag cxx becomes "1". Naturally, in the normal case where cxx is "1", all of the check position flags c0 to c31 of 32 ways become "0". If a 2-bit error occurs in any combination of the positions in the read data D0 to D31, all of the error position flags c0 to c31 and the no-error flag cxx become "0".

The error correcting circuit 6 at the last stage is a circuit of correcting a bit error in the read data D0 to D31 in accordance with the error position flags c0 to c31 and the no-error flag cxx as outputs of the syndrome decoding circuit 5 and, in the case where a 2-bit error which cannot be corrected occurs, generating an error output signal. The error position flags c0 to c31 of 32 ways are subjected to XOR operation with corresponding bits in the corresponding read data D0 to D31 and 2-input XOR circuits 10*a* to 10*z* and 10A to 10F. In the case where a 1-bit error occurs in bit in the read data D0 to D31, the value of the bit can be inverted to be reset to the original correct value. In the case where all of the error position flags c0 to c31 and the no-error flag cxx are supplied to the error signal generating circuit 7 and all of the values are "0", "1" is output as an error output signal notifying of occurrence of a 2-bit error. The error signal generating circuit 7 can be realized by, for example, a 33-input AND circuit with INV (NOT logic is added to all of input ports).

The parity check circuit 48 generates a nerr (no error) signal which becomes "1" in the case where no bit error occurs in the read data D0 to D31 by using a check matrix (not illustrated) which is paired with the parity generator matrix illustrated in FIG. 5. Each of columns of the check matrix corresponds to each of bits of read data and parities, each of rows corresponds to each of bits of a parity check result generated, and the check matrix is obtained by adding an identify matrix of 32 rows and 32 columns to the right side of the generator matrix. The parity check circuit 48 is a circuit of generating 32 kinds of parity check results by XOR operation from read data of two bits and a parity of one bit in any position corresponding to the element "1" in the check matrix and, concretely, generates y0 to y31 by the 3-input XOR circuits 49*a* to 49F, respectively. For example, to the input ports of the 3-input XOR circuit 49*a* generating y0 as a parity check result, the read data D0 and D1 and the parity X0 corresponding to the read data are coupled.

Each of the generated parity check results y0 to y31 of 32 kinds becomes "1" in the case where a 1-bit error occurs in any of read data of two bits covered by the corresponding parities X0 to X31 (that is, the value of the bit is inverted) and becomes "0" in the case where no bit error occurs. The parity check results y0 to y31 of 32 kinds are supplied to the 32-input AND circuit 50 with INV (NOT logic is added to all of input ports). In the case where all of the values are "0", "1" is output as a nerr signal indicating occurrence of no bit error. If a bit error (2-bit error) occurs in both of read data of two bits covered by any parity, or if a 1-bit error occurs in any of read data of two bits and, at the same time, a bit error (1-bit error) occurs in a corresponding parity of one bit, the parity check result becomes "0". Consequently, only from the single parity check result, the case cannot be distinguished from a case where no bit error occurs. However, since each of the bits of the read data D0 to D31 is covered by two kinds of parities in the parities X0 to X31 of 32 kinds, even if a 2-bit error or the like as described above which cannot be checked only from a single parity check result occurs, occurrence of a 1-bit error can be detected by another parity check result.

As understood from FIG. 7, occurrence of no bit error in the read data D0 to D31 in the ECC decoder circuit 3 can be detected at the time point when all of outputs of the five 15-input XOR circuits 8a to 8e and outputs of the two 14-input XOR circuits 8f and 8g are determined and an output of the 7-input AND circuit 9g with INV to which seven syndrome codes s0 to s6 are supplied is determined. Usually, a multi-input XOR circuit is realized by a configuration in which 2-input XOR circuits are coupled in a tree shape of multiple stages, so that process delay time until this point is considerably long. It takes more time until an error output signal is generated in the case where a 1-bit error occurs and is corrected or in the case where a 2-bit error occurs.

On the other hand, the parity check circuit 48 (refer to FIG. 6) can detect occurrence of no bit error in the read data D0 to D31 at the time point when all of outputs of the 32 pieces of 3-input XOR circuits 49a to 49F are determined and the output nerr of the 32-input AND circuit 50 with INV to which the 32 parity check results y0 to y31 are supplied is determined. The process delay time of the 3-input XOR circuit is much shorter than that of a 15-input XOR circuit. Since increase in the process delay time is relatively small even when the seven inputs of the AND circuit with INV becomes 32 inputs, the detection timing of no occurrence of a bit error in the parity check circuit 48 can be made sufficiently earlier than that of the ECC decoder circuit 3. That is, within one clock cycle of a CLK signal (for example, over 1 GHz) high frequency at which the CPU core 30 operates, occurrence of no bit error in the read data D0 to D31 can be detected.

Occurrence of no bit error in the read data D0 to D31 is indicated by "1" of the nerr signal as an output of the parity check circuit 48. On the contrary, "0" of the nerr signal at that time point denotes occurrence of a 1-bit error or 2-bit error in the read data D0 to D31. Consequently, when a 1-bit error occurs, the bit error has to be corrected. When a 2-bit error occurs, a notification that the 2-bit error is an uncorrectable bit error has to be sent to the CPU core 30. Those processes are executed by the ECC decoder circuit 3. Since the process delay time is shorter than two clock cycles but is longer than one clock cycle, the process of the CPU core 30 has to be made delayed only by one clock cycle.

The wait control circuit 19 is a circuit for generating a wait signal for making the process of the CPU core 30 wait. In the case where occurrence of a 1-bit error or 2-bit error is detected by the parity check circuit 48 and the nerr signal as an output of the parity check circuit 48 becomes "0", a positive pulse signal which is "1" until the rise of the next CLK signal is generated in the same clock cycle and is output as a wait signal. It is realized by the flip-flop (register) circuit 27a and the 2-input AND circuit 28 with INV. Accordingly, the CPU core 30 stalls only by its one clock cycle and restarts the process in the next clock cycle. Therefore, in the next clock cycle, the corrected output data d'0 to d'31 obtained by performing 1-bit error correction on the read data or an error output signal as a result of the 2-bit error detection has to be accurately transmitted to the CPU core 30. It can be realized by switching the path of the 2-system data switching circuit 46 to the output side of the ECC decoder circuit 3 by a signal obtained by delaying the wait signal only by one clock cycle by the flip-flop (register) circuit 27b and controlling the signal from the ECC decoder circuit 3 to be output via the 2-input AND circuit 47.

As described above, according to the first embodiment, by providing total 32 kinds of parities so as to cover each of bits of 32-bit data by two kinds of parities, 2-bit error detection similar to the 1-bit error correction/2-bit error detection by a 7-bit ECC can be realized. By generating each of the parities to be added from the smaller number of bits (concretely, two bits), a parity check can be realized by using 32 pieces of XOR circuits to which the smaller number of (concretely, three) signals are supplied, and increase in speed can be achieved.

Second Embodiment

The configuration and operation of a data processing apparatus according to a second embodiment will be described with reference to the drawings.

A data processing apparatus 100 according to the second embodiment is obtained by changing the configuration of the parity/ECC encoder circuit 52 configured by the ECC generating circuit 1 and the parity generating circuit 11 in the data processing apparatus 100 according to the first embodiment illustrated in FIG. 1 to a parity/ECC encoder circuit 53 of an integral type. The parity/ECC decoder 31 is substantially the same.

Figure 9:
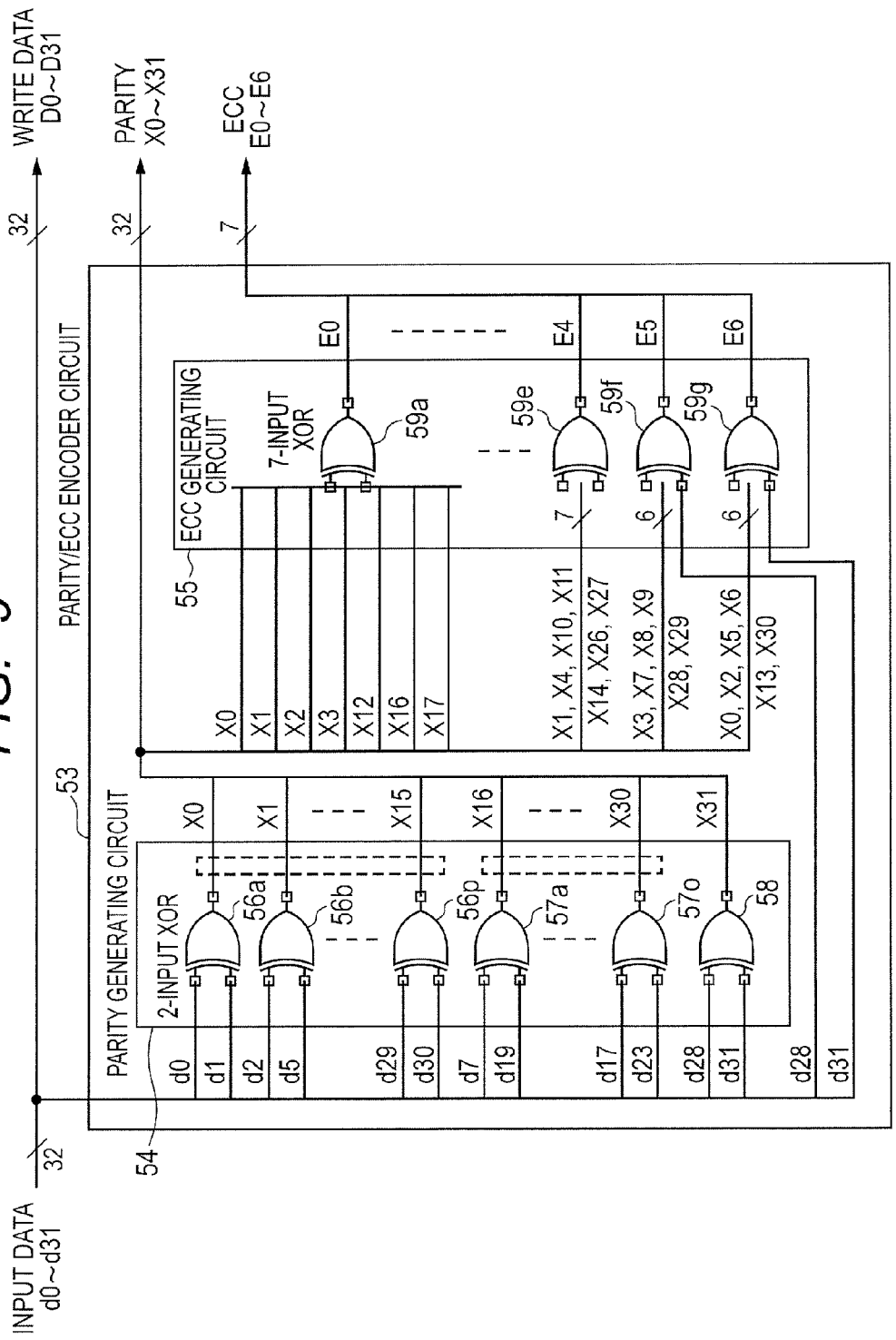
FIG. 9 is a block diagram expressing a configuration example of a parity/ECC encoder circuit 53 in a data processing apparatus 100 according to a second embodiment.

FIG. 9 is a block diagram expressing a configuration example of the parity/ECC encoder circuit 53. The parity/ECC encoder circuit 53 includes a parity generating circuit 54 and an ECC generating circuit 55. The parity generating circuit 54 includes 16 pieces of 2-input XOR circuits 56a to 56p, 15 pieces of 2-input XOR circuits 57a to 57o, and one 2-input XOR circuit 58. The ECC generating circuit 55 is includes by seven 7-input XOR circuits 59a to 59g.

The parity/ECC encoder circuit 53 is a circuit of generating 1-bit parities X0 to X31 of 32 kinds by the parity generating circuit 54 from the input data d0 to d31 of 32 bits and generating 7-bit ECCs D0 to E6 by the ECC generating circuit 55 by using the parities X0 to X31. The point that the generator matrix (G) illustrated in FIG. 3 and the ECC check matrix (H) illustrated in FIG. 8 correspond to each other is the same as that of the first embodiment. Although the point that 32 kinds of parities are provided is the same as that of the first embodiment, in the second embodiment, a parity generator matrix different from that of the first embodiment illustrated in FIG. 5 is used.

FIG. 10 illustrates a parity generator matrix of the parity generating circuit 54 in the second embodiment. The parity generator is configured so that two "1" elements are included in each of the rows X0 to X31 and two "1" elements are included in each of the columns d0 to d31, but is different from that shown in FIG. 5 and used in the first embodiment. The 32 kinds of parities X0 to X31 are divided in three groups; 16 kinds of parities X0 to X15 (first group), 15 kinds of parities X16 to X30 (second group), and one kind of parity X31 (third group).

The parity generating circuit 54 is a circuit of generating each of bits of the parities by XOR operation from input data of two bits corresponding to the elements "1" in the generator matrix so as to generate the parities X0 to X31 from the input data d0 to d31 in accordance with the generator matrix. Concretely, the parity generating circuit 54 generates each of X0 to X31 by the 2-input XOR circuits 56a to 56p, 57a to 57o, and 58. The divisions of the three groups are illustrated. For example, taking a look at the row X1 as the second row from the top of the generator matrix, it is understood that input data corresponding to two columns including the element "1" is d2 and d5. In a form corresponding to it, two bits of the same input data d2 and d5 are coupled to the input ports of the 2-input XOR circuit 56b which generates X1.

Figure 11:
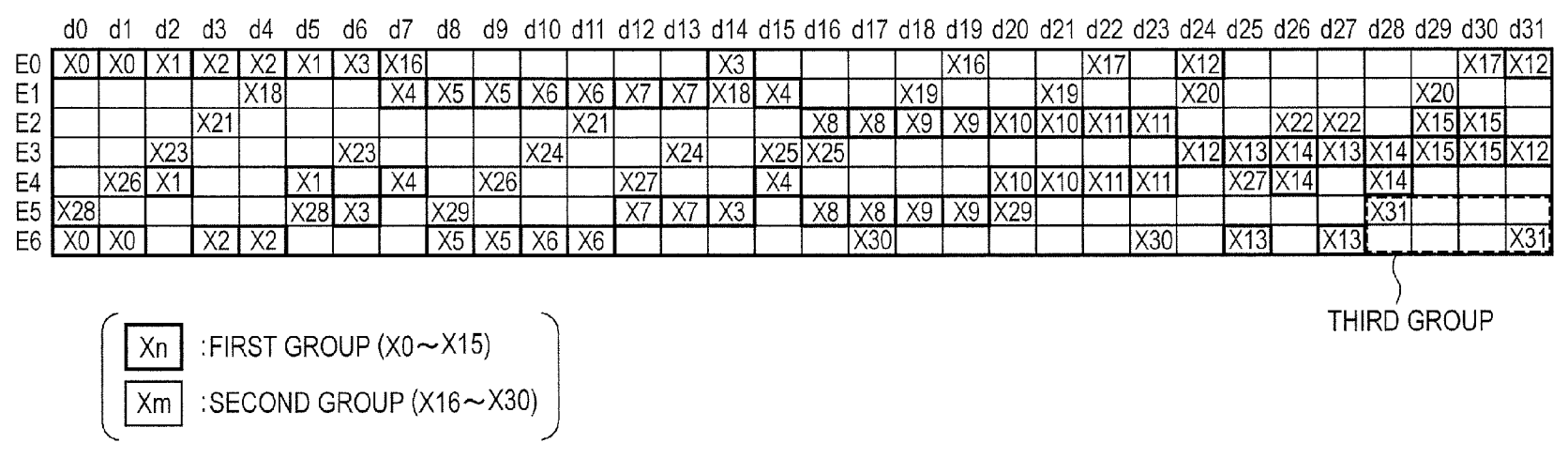

The ECC generating circuit 55 is a circuit for generating the ECCs E0 to E6 corresponding to the generator matrix illustrated in FIG. 3 but is different from the first embodiment with respect to the point that the parities X0 to X31 generated by the parity generating circuit 54 are used as partial sums to generate an ECC. To enable it, the configuration of the parity generator matrix illustrated in FIG. 10 is devised. The idea of the configuration is illustrated in FIG. 11. In the positions of the element "1" in the ECC generator matrix illustrated in FIG. 3, the symbols X0 to X31 indicating the 32 kinds of parities X0 to X31 used by the bits of input data corresponding to the positions are written. Two of X0 to X15 as the first group indicated by the thick frame lines are included in any two rows in the rows E0 to E6. Two of X16 to X30 as the second group are included in any one row in the rows E0 to E6. Further, one X31 as the third group is included in each of predetermined two rows (concretely, the row E5 and column d28 and the row E6 and column d31).

It is understood from FIG. 11 that ECCs E0 to E6 can be generated by using the parities X0 to X31 as partial sums. The ECC generating circuit 55 is a circuit for accordingly generating each of bits of ECCs by XOR operation from the parities X0 to X30 (X31 is not included) and the input data d28 and d31. FIG. 12 illustrates a state of the generation in the form of a matrix. The matrix is a matrix in which each row corresponds to each of bits of a parity and each column corresponds to each of bits of an ECC generated. It is easily understood that the matrix of FIG. 12 is arranged on the side of the parity generator matrix illustrated in FIG. 10. Concretely, E0 to E6 are generated by the 7-input XOR circuits 59a to 59g, respectively. Seven kinds of parities in the parities X0 to X30 are coupled to the input ports of the five pieces of 7-input XOR circuits 59a to 59e which generate the ECCs E0 to E4. On the other hand, predetermined parities are coupled to six input ports out of the input ports of the two pieces of 7-input XOR circuits 59f and 59g which generate the ECCs E5 and E6, and predetermined input data is coupled to the remaining one port (d28 to the 7-input XOR circuit 59f, and d31 to the 7-input XOR circuit 59g).

A parity/ECC decoder circuit corresponding to the above-described parity/ECC encoder circuit 53 has the same configuration as that of the parity/ECC decoder circuit 31 illustrated in FIG. 6 in the first embodiment but is different with respect to coupling of bits in the read data D0 to D31 to the input ports of the 3-input XOR circuits 49a to 49F in the parity check circuit 48. The coupling corresponds to coupling in the 2-input XOR circuits 56a to 56p, 57a to 57o, and 58 of 32 kinds in the parity generating circuit 54. The other configuration and operation of the wait control circuit 19 and the ECC decoder circuit 3 are the same as those in the case of the first embodiment.

According to the above-described second embodiment, in a manner similar to the first embodiment, by providing total 32 kinds of parities so as to cover each of bits of 32-bit data by two kinds of parities, 2-bit error detection similar to the 1-bit error correction/2-bit error detection by a 7-bit ECC can be realized. By generating each of the parities to be added from the smaller number of bits (concretely, two bits), a parity check can be realized by using 32 pieces of XOR circuits to which the smaller number of (concretely, three) signals are supplied, and increase in speed can be achieved.

Further, by generating the ECCs E0 to E6 using the generated 32 kinds of parities as partial sums, the circuit scale of the ECC generating circuit 55 can be reduced, and process delay time can be shortened.

Third Embodiment

The configuration and operation of a data processing apparatus according to a third embodiment will be described with reference to the drawings.

The third embodiment is the same as the second embodiment with respect to the point that a generated parity is used as a partial sum to generate an ECC but is changed so as to generate only one bit in an ECC from input data and the number of kinds of parities is decreased from 32 kinds to 25 kinds.

Figure 13:
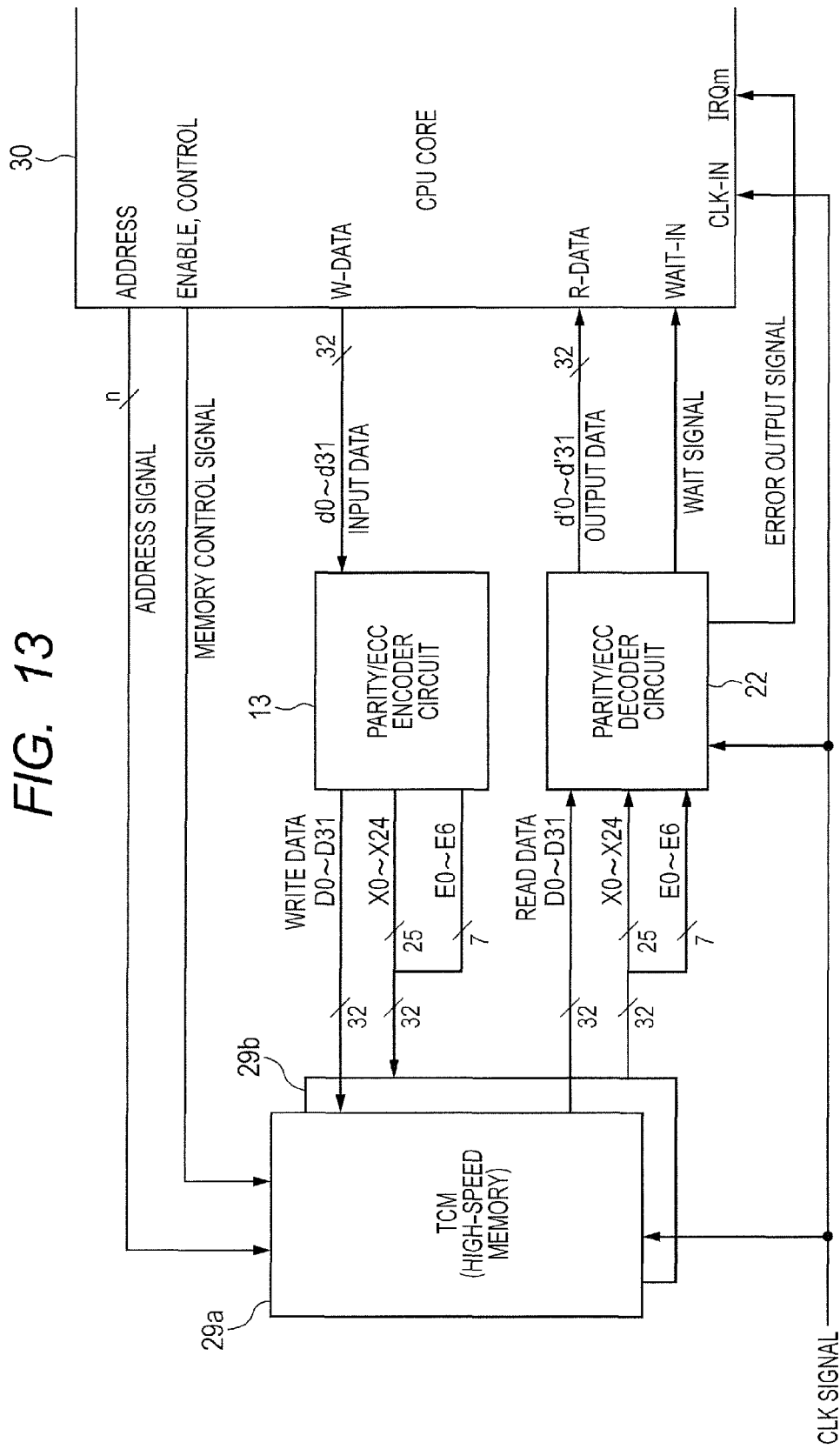
FIG. 13 is a block diagram expressing a configuration example of a data processing apparatus 100 according to a third embodiment.

FIG. 13 is a block diagram expressing a configuration example of a data processing apparatus according to a third embodiment. A data processing apparatus 100 according to the third embodiment includes the CPU core 30 as an example of a processor, high-speed memories (TCMs) 29a and 29b tightly coupled to the CPU core 30 as an example of the memory, a parity/ECC encoder circuit 13, and a parity/ECC decoder circuit 22. Although the memory includes one TCM 51 in the data processing apparatus 100 of the first embodiment, in the third embodiment, the memory includes two TCMs 29a and 29b. The TCM 29a is a memory for holding data of 32 bits (write data and read data) itself which is processed by the CPU core 30, and the TCM 29b is a memory for holding ECCs of seven bits and parities of 25 bits accompanying the data. An address signal and a memory control signal from the CPU 30 are commonly supplied to both the TCMs 29a and 29b. Each of the memories is an SRAM having a data width of 32 bits and (2^n) pieces of address spaces. For example, the TCMs 29a and 29b includes memories having physically different memory cell arrays allocated to the same address space.

Figure 14:
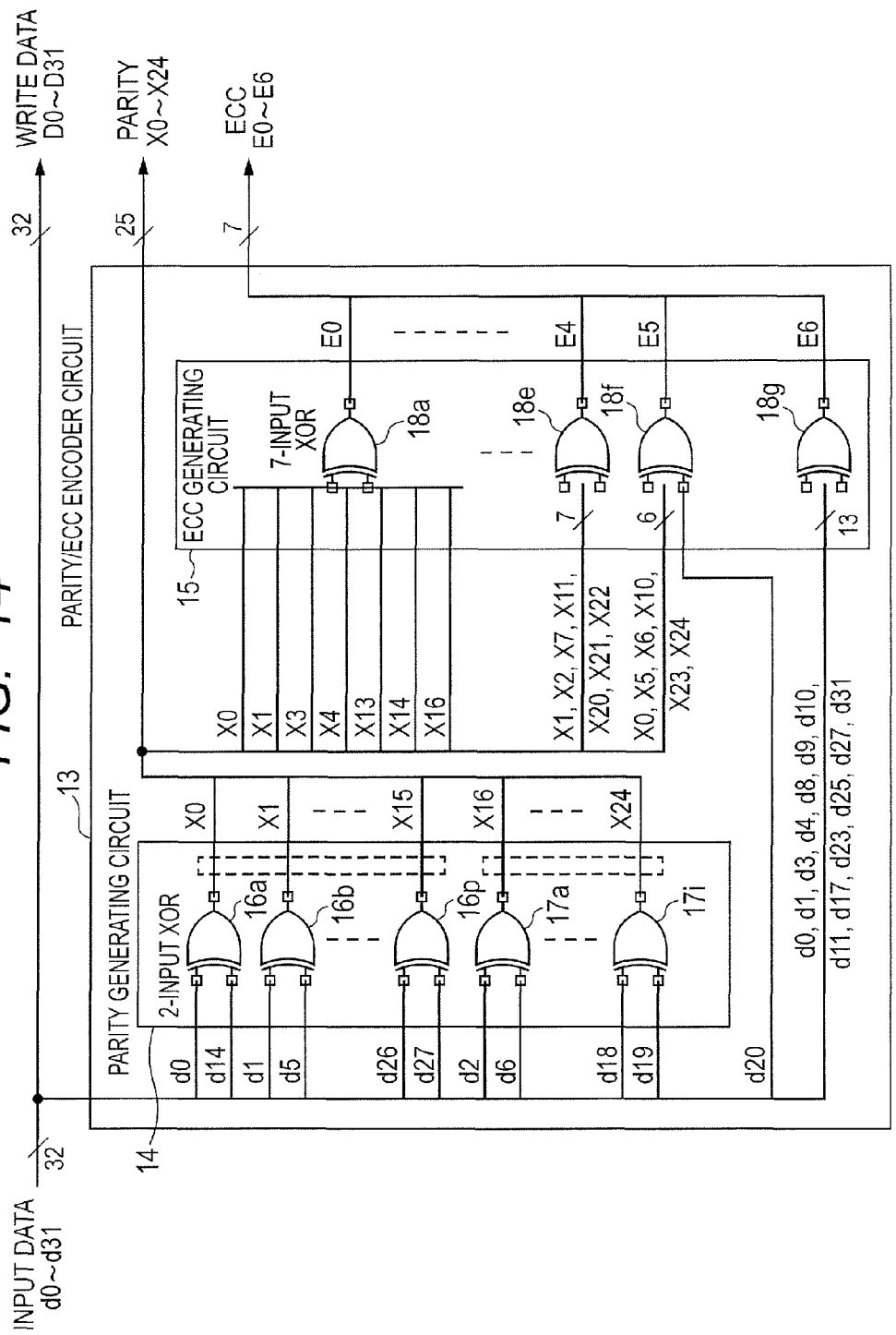
FIG. 14 is a block diagram expressing a configuration example of a parity/ECC encoder circuit 13.

FIG. 14 is a block diagram expressing a configuration example of the parity/ECC encoder circuit 13. The parity/ECC encoder circuit 13 includes a parity generating circuit 14 and an ECC generating circuit 15. The parity generating circuit 14 includes 16 pieces of 2-input XOR circuits 16a to 16p and nine pieces of 2-input XOR circuits 17a to 17i. The ECC generating circuit 15 includes six pieces of 7-input XOR circuits 18a to 18f and one 13-input XOR circuit 18g.

The parity/ECC encoder circuit 13 is a circuit for generating 25 kinds of 1-bit parities X0 to X24 from the input data d0 to d31 of 32 bits by the parity generating circuit 14 and generating 7-bit ECCs D0 to E6 by the ECC generating circuit 15 by using the parities X0 to X24. The point corresponding to the ECC generator matrix (G) illustrated in FIG. 3 and the ECC check matrix (H) illustrated in FIG. 8 is the same as that of the first and second embodiments. The third embodiment is different from the first and second embodiments with respect to the point that 25 kinds of parities are used.

FIG. 15 illustrates a generator matrix of 25 kinds of parities in the third embodiment. The generator matrix is configured so that two "1" elements are included in each of the rows X0 to X24 and basically two "1" elements are included in each of the columns d0 to d31. As an exception, only in the 14 columns indicated by up-pointing arrows at the bottom of the generator matrix (concretely, columns d0, d1, d3, d4, d8, d9, d10, d11, d17, d20, d23, d25, d27, and d31), the number of the element "1" is one. The 25 kinds of parities X0 to X24 are divided in two groups; a first group made of 16 kinds of parities X0 to X15, and a second group made of nine kinds of parities X16 to X24.

The parity generating circuit 14 is a circuit for generating each of bits of parities by XOR operation from input data of two bits corresponding to the element "1" in the generator matrix so as to generate the parities X0 to X24 from the input data d0 to d31 in accordance with the generator matrix. Concretely, the parities X0 to X15 of the first group are generated by the 2-input XOR circuits 16a to 16p, and the parities X16 to X24 of the second group are generated by the 2-input XOR circuits 17a to 17i. For example, taking a look at the row X0 as the head row of the generator matrix, it is understood that the input data corresponding to two columns including the element "1" is d0 and d14. In a form corresponding to it, two bits (d0 and d14) in the input data are coupled to the input ports of the 2-input XOR circuit 16a which generates X0.

The ECC generating circuit 15 is a circuit for generating the ECCs D0 to E6 corresponding to the generator matrix illustrated in FIG. 3 but is different from the first embodiment with respect to the point that the parities X0 to X24 generated by the parity generating circuit 13 are used as partial sums for generation of the ECCs. To enable it, the configuration of the parity generator matrix illustrated in FIG. 15 is devised. The number of kinds of parities and the method of generating an ECC using a parity are different from those of the second embodiment, and FIG. 16 illustrates the idea in the third embodiment. In the positions of the element "1" in the ECC generator matrix illustrated in FIG. 3, the symbols X0 to X24 indicating the 25 kinds of parities X0 to X24 used by the bits of input data corresponding to the positions are written. Two of X0 to X15 as the first group indicated by the thick frame lines are included in any two rows in the rows E0 to E5. Two of X16 to X24 as the second group are included in any one row in the rows E0 to E5. As an exception, X0 to X24 D0 not appear but the original element "1" remains in the row E6 and, similarly, the original element "1" remains in the row E5 and column d20.

It is understood from FIG. 16 that ECCs E0 to E5 (excluding E6) can be generated by using the parities X0 to X24 as partial sums. The ECC generating circuit 15 includes a circuit for accordingly generating each of bits of ECCs by XOR operation from the parities X0 to X24 and the input data d20 and a circuit for generating the ECC E6 from a part of the input data d0 to d31. FIG. 17 illustrates a state of the generation in the form of a matrix. The matrix is a matrix in which each row corresponds to each of bits of a parity and each column corresponds to each of bits of an ECC generated. It is easily understood that the matrix of FIG. 17 is arranged on the side of the parity generator matrix illustrated in FIG. 15. Concretely, E0 to E5 are generated by the 7-input XOR circuits 18a to 18f, respectively. Seven kinds of parities in the parities X0 to X24 are coupled to the input ports of the five pieces of 7-input XOR circuits 18a to 18e which generate the ECCs E0 to E4. Predetermined parities are coupled to six input ports out of the input ports of the 7-input XOR circuit 18f which generates the ECC E5, and the input data d20 is coupled to the remaining one port. Only the ECC E6 is generated directly from a part of the input data d0 to d31 by the 13-input XOR circuit 18g which is the same as the 13-input XOR circuit 2g in the ECC generating circuit 1 in the first embodiment illustrated in FIG. 2.

Figure 18:
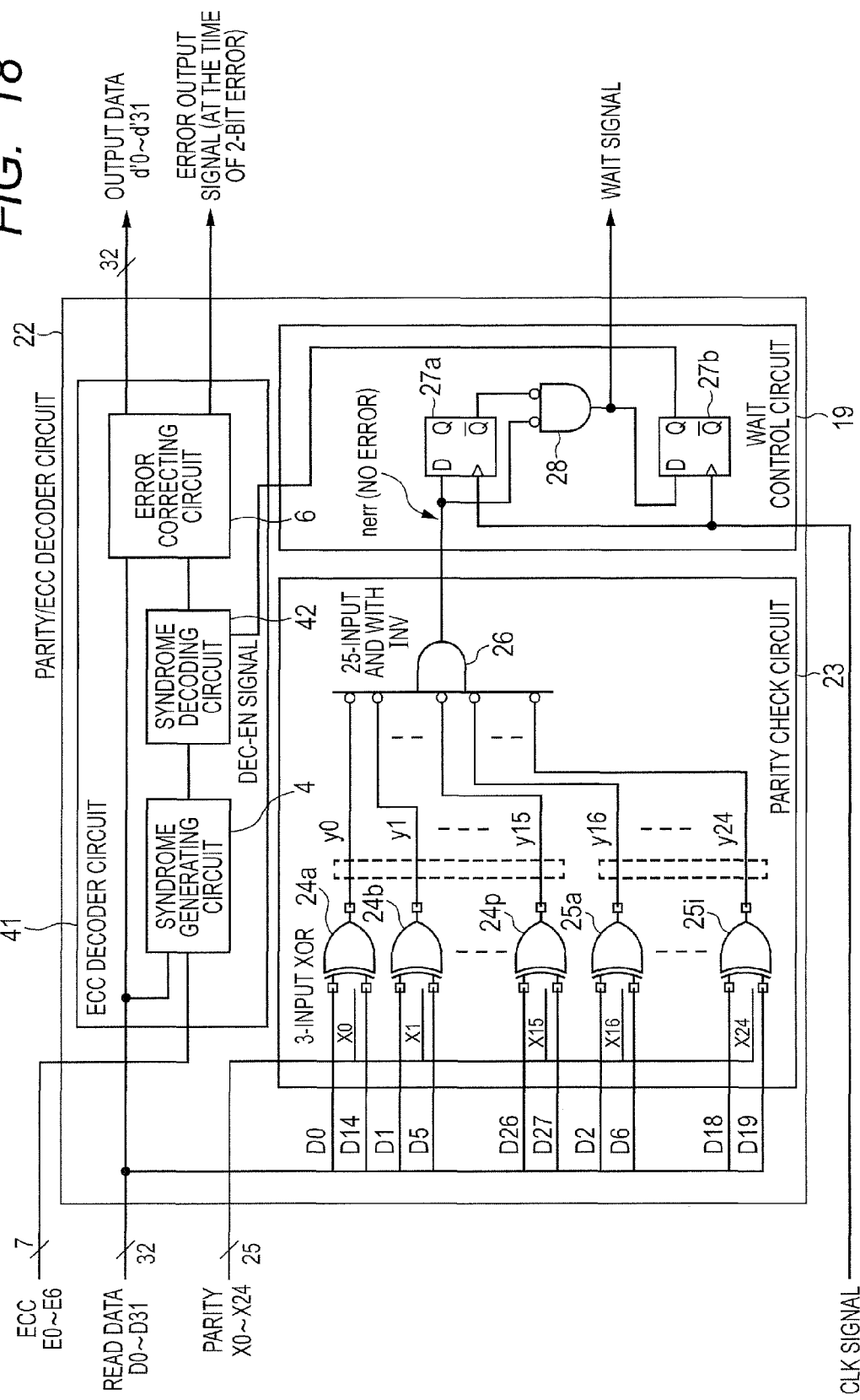
FIG. 18 is a block diagram expressing a configuration example of a parity/ECC decoder circuit 22.

FIG. 18 is a block diagram expressing a configuration example of the parity/ECC decoder circuit 22. The parity/ECC decoder circuit 22 has the function corresponding to that of the above-described parity/ECC encoder circuit 13. The parity/ECC decoder circuit 22 is similar to the configuration of the parity/ECC decoder circuit 31 illustrated in FIG. 6 in the first embodiment with respect to the point that the parity/ECC decoder circuit 22 includes an ECC decoder circuit 41, a parity check circuit 23, and the wait control circuit 19, but is partly different in accordance with the difference in the number of kinds of parities and the difference in the mask control method of the output data d' 0 to d' 31 and the error output signal.

The parity check circuit 23 included in the parity/ECC decoder circuit 22 according to the third embodiment corresponds to a check matrix (not illustrated) which is paired with the parity generator matrix illustrated in FIG. 15. The parity check circuit 23 generates 25 kinds of parity check results y0 to y24 from the read data D0 to D31 and the parities X0 to X24, and generates a nerr (no error) signal which becomes "1" in the case where no bit error occurs in the read data D0 to D31 from all of the parity check results. The parity check circuit 23 is a circuit of generating 25 kinds of parity check results by XOR operation from read data of two bits and the parity of one bit in any position corresponding to the element "1" in the check matrix. Concretely, y0 to y24 are generated by 3-input XOR circuits 24a to 24p and 25a to 25i, respectively. For example, to the input ports of the 3-input XOR circuit 24a which generates y0 as the parity check result, the read data D0 and D14 and the parity X0 corresponding to the data are coupled.

Each of the generated parity check results y0 to y24 of 25 kinds becomes "1" in the case where a 1-bit error occurs in any of read data of two bits covered by the corresponding parities X0 to X24 and becomes "0" in the case where no bit error occurs. The parity check results y0 to y24 of 25 kinds are supplied to a 25-input AND circuit 26 with INV. In the case where all of the values are "0", "1" is output as a nerr signal indicating occurrence of no bit error.

If a bit error (2-bit error) occurs in both of read data of two bits covered by any parity, the parity check result becomes "0". Consequently, only from the single parity check result, the case cannot be distinguished from a case where no bit error occurs. However, since at least any one bit of the 2-bit read data is covered by a parity of another kind (as an exception, only input data d20 and d23 covered with the parity X11 is not covered with a parity of another kind). Consequently, even if a 2-bit error or the like as described above which cannot be detected only from a single parity check result occurs, occurrence of a 1-bit error can be detected by another parity check result.

The read data D0 to D31 is data held in the TCM 29a, and the parities X0 to X24 are data held together with the ECCs E0 to E6 in the another TCM 29b. Consequently, the possibility that a 1-bit error occurs (in the TCM 29a) in any one of read data of two bits covered with any parity and, at the same time, a bit error (1-bit error) occurs in a parity of corresponding one bit may be regarded as substantially zero.

In the embodiment, as described above, only the input data d20 and d23 covered with the parity X11 is not exceptionally covered with a parity of another kind. Consequently, although it is obvious that the possibility of occurrence is extremely low, there is a weak point that only in the case where a bit error (2-bit error) occurs incidentally in D20 and D23 in the read data D0 to D31 held in the same TCM 29a, the 2-bit error cannot be detected by the parity check circuit 23. However, it is actually easy to cover the weak point.

For example, it is sufficient to generate the parity X25 of another kind from input data of two bits made by one of bits of the input data d20 and d23 and another bit selected from the input data d0 to d31 and, in correspondence with the generation, additionally use the parity check result y25 of the 26th kind for generation of the nerr (no error) signal in the parity check circuit 23. Alternatively, it is sufficient to use any one bit of the input data d20 and d23 as an additional bit at the time of generating any of the 24 kinds of parities except for the parity X11 (that is, to generate only the parity from input data of three bits).

The configuration and operation of the wait control circuit 19 are similar to those in the case of the first embodiment except that, in the third embodiment, a control signal (a signal obtained by delaying a wait signal only by one clock cycle) supplied to the 2-system data switching circuit 46 in FIG. 6 is supplied as a DEC-EN signal to a syndrome decoding circuit 42 in the ECC decoder circuit 41.

Figure 19:
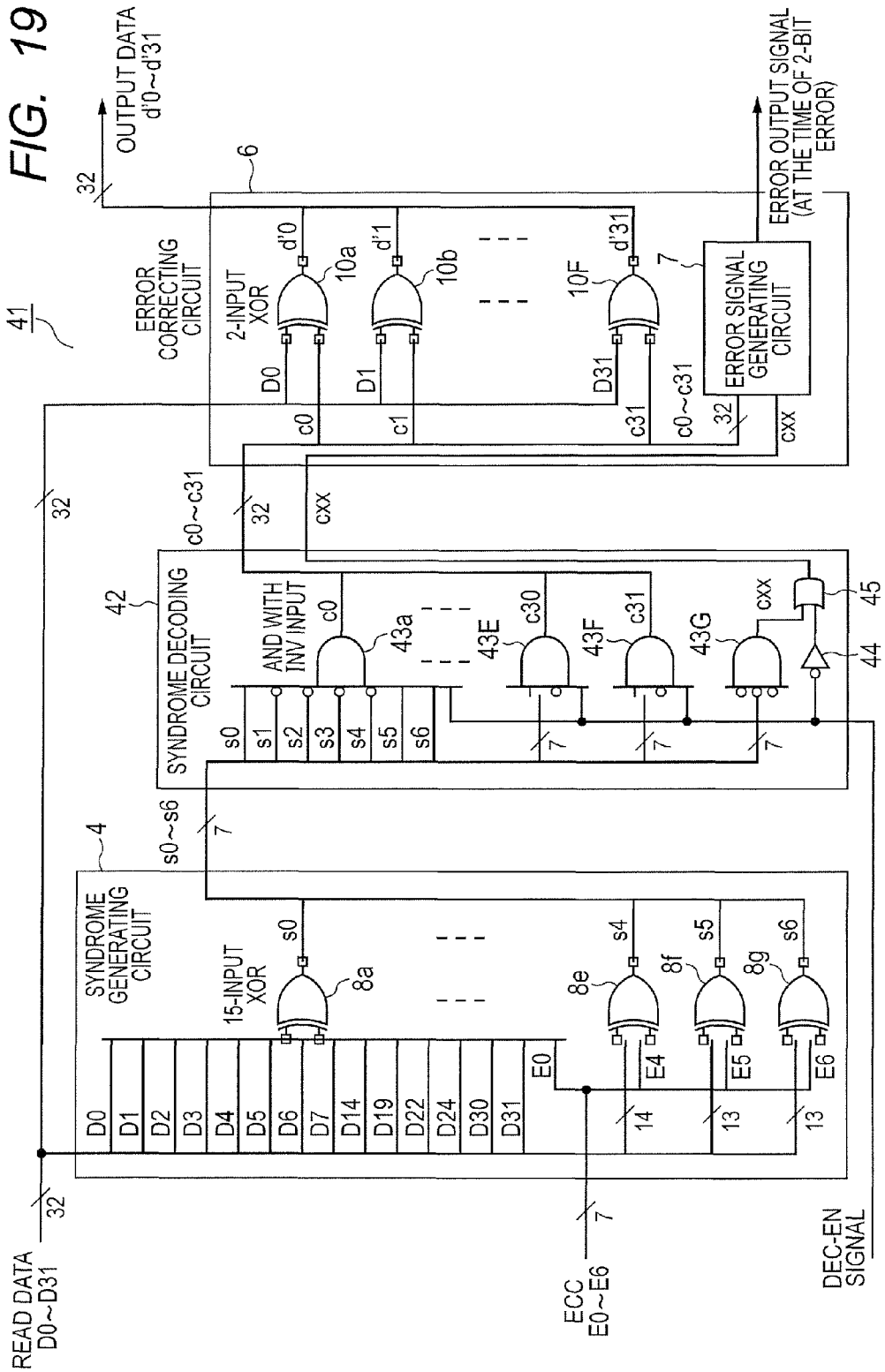
FIG. 19 is a block diagram expressing a more detailed configuration example of an ECC decoder circuit 41.

FIG. 19 is a block diagram expressing a more detailed configuration example of the ECC decoder circuit 41. Like the ECC decoder circuit 3 according to the second embodiment illustrated in FIG. 7, the ECC decoder circuit 41 includes the syndrome generating circuit 4, the syndrome decoding circuit 42, the error correcting circuit 6, and the error signal generating circuit 7. Each of the syndrome generating circuit 4, the error correcting circuit 6, and the error signal generating circuit 7 is the same as that illustrated in FIG. 7. The syndrome decoding circuit 42 includes 32 pieces of 8-input AND circuits 43a to 43z and 43A to 43F with partial INV (NOT logic is added only to four input ports), a 7-input AND circuits 43G with INV (NOT logic is added to all of input ports), an INV (NOT) circuit 44, and a 2-input OR circuit 45.

The DEC-EN signal is supplied from the wait control circuit 19 to the syndrome decoding circuit 42. Only when the value is "1", 32 ways of error position flags c0 to c31 and a no-error flag cxx are made meaningful data. When the value is "0", all of the error position flags c0 to c31 are masked to "0" and the no-error flag cxx is fixed to "1". With the configuration, the error correcting circuit 6 performs desired operation only at a necessary timing, so that the 2-system data switching circuit 46 and the 2-input AND circuit 47 in the first embodiment illustrated in FIG. 6 become unnecessary.

According to the above-described third embodiment, in a manner similar to the first and second embodiments, by providing total 25 kinds of parities so as to cover each of bits of 32-bit data with two kinds of parities (a part is exception), 2-bit error detection similar to the 1-bit error correction/2-bit error detection by ECCs of seven bits becomes possible. By generating each of parities to be added from the smaller number of bits (concretely, two bits), a check by a parity can be realized by using 25 pieces of XOR to which the small number of (concretely, three) signals, and increase in speed can be achieved.

Further, by generating ECCs (except for only E6) by using the generated 25 kinds of parities as partial sums, the circuit scale of the circuit for generating ECCs can be reduced, and the process delay time can be shortened.

Although the configuration of adding 32 kinds of parities is employed in the first and second embodiments, the third embodiment employs the configuration with the parities of the number of kinds reduced to 25. Consequently, the capacity of the high-speed memory (TCM), the circuit scale of the circuit of performing a check with a parity and generation of a parity, and process delay time can be suppressed.

Fourth Embodiment

The configuration and operation of a data processing apparatus according to a fourth embodiment will be described with reference to the drawings.

Figure 20:
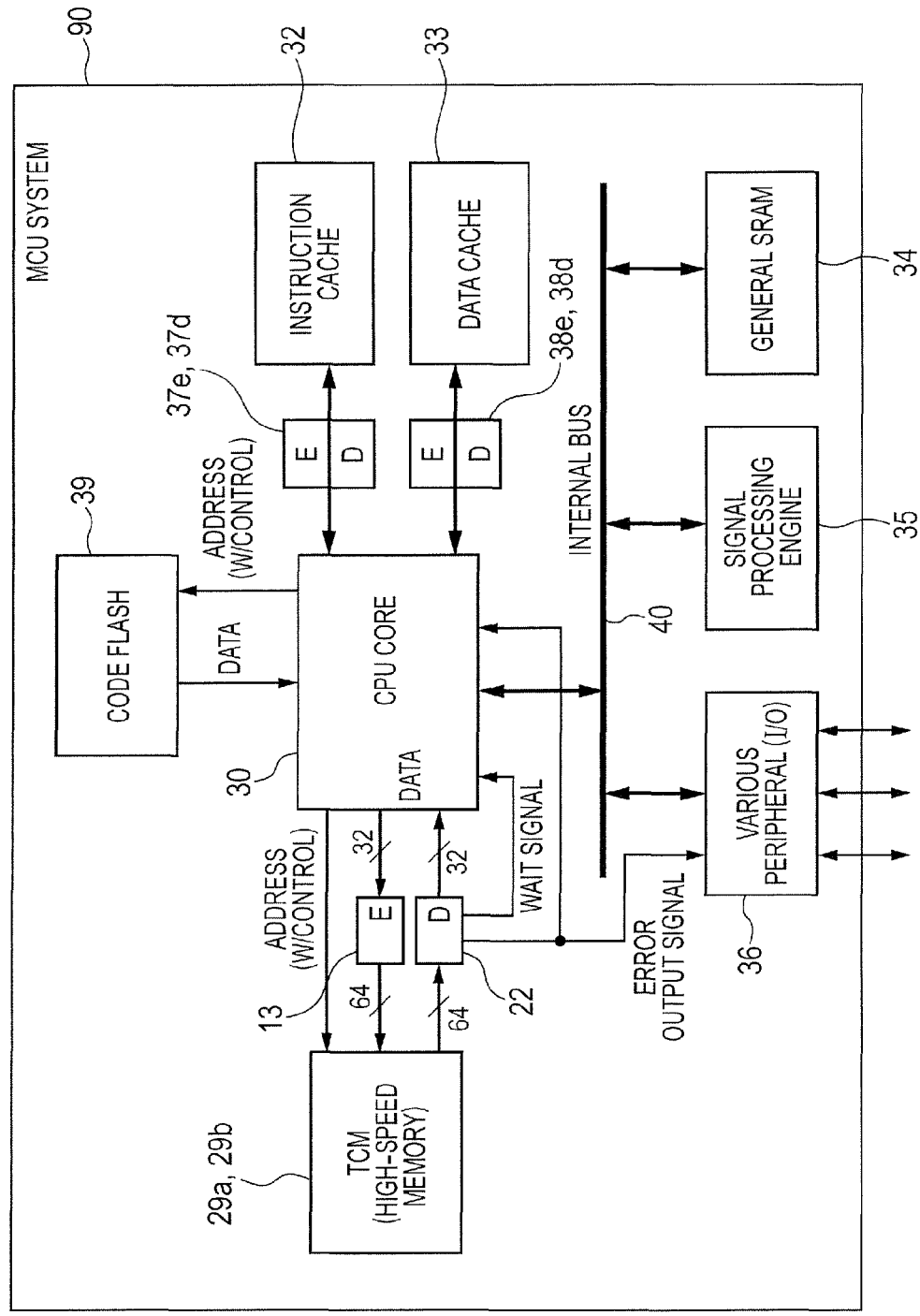
FIG. 20 is a block diagram expressing a configuration example of a data processing apparatus 100 according to a fourth embodiment.

FIG. 20 is a block diagram expressing a configuration example of a data processing apparatus according to the fourth embodiment. The data processing apparatus according to the fourth embodiment is an MCU system 90 in which the error correcting method and circuit representatively described in the first to third embodiments are applied to an interface circuit between a CPU core which operates at high speed and a TCM (high-speed memory) tightly coupled to the CPU core and a cache. The MCU system 90 includes the CPU core 30, the high-speed memories (TCMs) 29a and 29b, an instruction cache 32, a data cache 33, a flash memory (code flash) 39, a general SRAM 34, a signal processing engine 35, and various peripheral (I/O) circuits 36. The general SRAM. 34, the signal processing engine 35, and the various peripheral (I/O) circuits 36 are coupled to the CPU 30 via an internal bus 40.

Between the CPU core 30 and the high-speed memories (TCMs) 29a and 29b, the parity/ECC encoder circuit 13 and the parity/ECC decoder circuit 22 which are the same as those in the third embodiment are provided.

Instruction codes sequentially executed by the CPU core 30 are stored in the code flash 39. However, it takes time to access (read) data from the code flash 39, so that the instruction cache 32 as a high-speed memory capable of performing data reading process in one clock cycle of a CLK signal of the same high frequency (for example, over 1 GHz) as that at which the CPU core 30 operates is provided. Between the CPU core 30 and the instruction cache 32, a parity generating circuit 37e and a parity check circuit 37d as interface circuits are provided. The parity generating circuit 37e is a circuit for generating a plurality of kinds of parities capable of detecting a 2-bit error in addition to a 1-bit error and its configuration and operation are the same as those of the parity generating circuit 11 in the first embodiment illustrated in FIG. 4 (and its parity generator matrix is the same as that illustrated in FIG. 5). The parity check circuit 37d is a circuit for detecting occurrence of a 1-bit error or 2-bit error from the kinds of parities and its configuration and operation are the same as those of the parity check circuit 48 in the parity/ECC decoder circuit 31 in the first embodiment illustrated in FIG. 6. In the case where a 1-bit error or 2-bit error occurs in an instruction code in the instruction cache 32, the nerr (no error) signal (not illustrated) output from the parity check circuit 48 to the CPU core 30 becomes "0", and the CPU core 30 reads again a correct instruction code from the code flash 39 and re-stores it into the instruction cache 32, thereby eliminating the influence of the bit error.

The general SRAM 34 to/from which data can be accessed (read or written) via the internal bus 40 is used as a work memory region used for processing by the CPU core 30. However, the data access takes time of a plurality of clock cycles. Consequently, the data cache 33 as a high-speed memory capable of accessing data at high speed in one clock cycle is provided. Between the CPU core 30 and the data cache 33, a parity/ECC encoder circuit 38e and a parity/ECC decoder circuit 38d are provided as interface circuits. The configuration and operation of the parity/ECC encoder circuit 38c are the same as those of the parity/ECC encoder circuit 13 in the third embodiment illustrated in FIG. 14 (a parity generator matrix to which the parity generating circuit 14 corresponds is that illustrated in FIG. 15). The configuration and operation of the parity/ECC decoder circuit 38d are the same as those of the parity/ECC decoder circuit 22 in the third embodiment illustrated in FIG. 18. In the case where a 1-bit error occurs in data stored in the data cache 33, a wait signal (not illustrated) is output as a positive pulse signal to the CPU core 30 only in one clock cycle, and the bit error is corrected by the parity/ECC decoder circuit 38d. In the case where a 2-bit error occurs, an error output signal (not illustrated) is output to the CPU core 30.

The signal processing engine 35 is a hardware accelerator circuit for assisting the process of the CPU core 30. The various peripheral (I/O) circuits 36 are various control circuits for controlling various input/output ports from/to the outside in the MCU system 90. As one of the circuits, an error management module (not illustrated) for managing states of various errors which occur in the MCU system 90 in a lump is also provided. Consequently, error output signals output from the parity/ECC decoder circuits 22 and 38d are supplied to the error management module.

Other Embodiments

Other embodiments (variations) will be described with reference to the drawings.

In the first and second embodiments, it is a precondition that the TCM (high-speed memory) tightly coupled to the CPU core includes a single memory. In the first embodiment, 32 kinds of parities are generated independently of generation of ECCs. In the second embodiment, after 32 kinds of parities are generated, ECCs are generated using the parities as partial sums. In the third embodiment, it is a precondition that the TCM (high-speed memory) tightly coupled to the CPU core includes two memories, data of 32 bits is held in one of the memories, and an ECC and a parity accompanying the data are held in the other memory, and 25 kinds of parities are generated and, after that, ECCs are generated using the parities as partial sums. On the same precondition as that of the third embodiment, a parity can be also generated independently of generation of an ECC.

Figure 21:
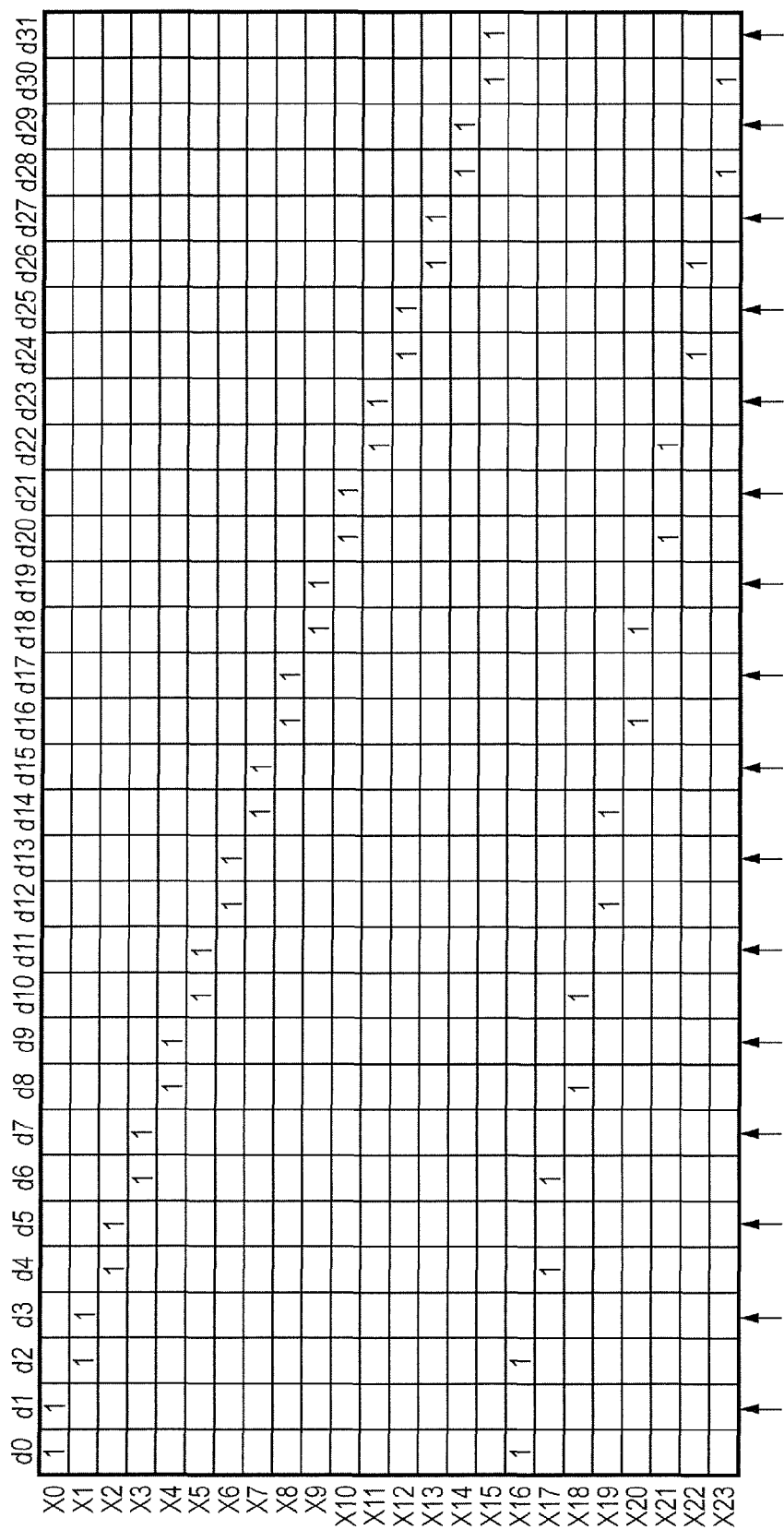
FIG. 21 illustrates a generator matrix of another parity, which can be applied under the same precondition as that of the third embodiment.

FIG. 21 illustrates an example of a parity generator matrix. A parity is generated from any two bits in the input data d0 to d31, and total 24 kinds of parities are provided. The half of bits of input data (concretely, d0, d2, d4, d6, d8, d10, d12, d14, d16, d18, d20, d22, d24, d26, d28, and d30) are covered with two kinds of parities, and the remaining half of bits indicated by up-pointing arrows at the bottom of the generator matrix are covered with only one kind of parity. The generator matrix is configured in a regular, simple form so that the other bit used for the latter parity is covered with another kind of parity.

Even if a bit error (2-bit error) occurs in both of read data of two bits covered with any parity, at least one bit is covered with the other kind of parity, so that the 2-bit error can be detected by the parity check circuit. The idea is the same as that of the third embodiment. Although 25 kinds of parities are necessary in the third embodiment of generating ECCs by using parities as partial sums, the embodiment is different with respect to the point that parities of 24 kinds which is smaller than 25 kinds by one are sufficient.

Figure 22:
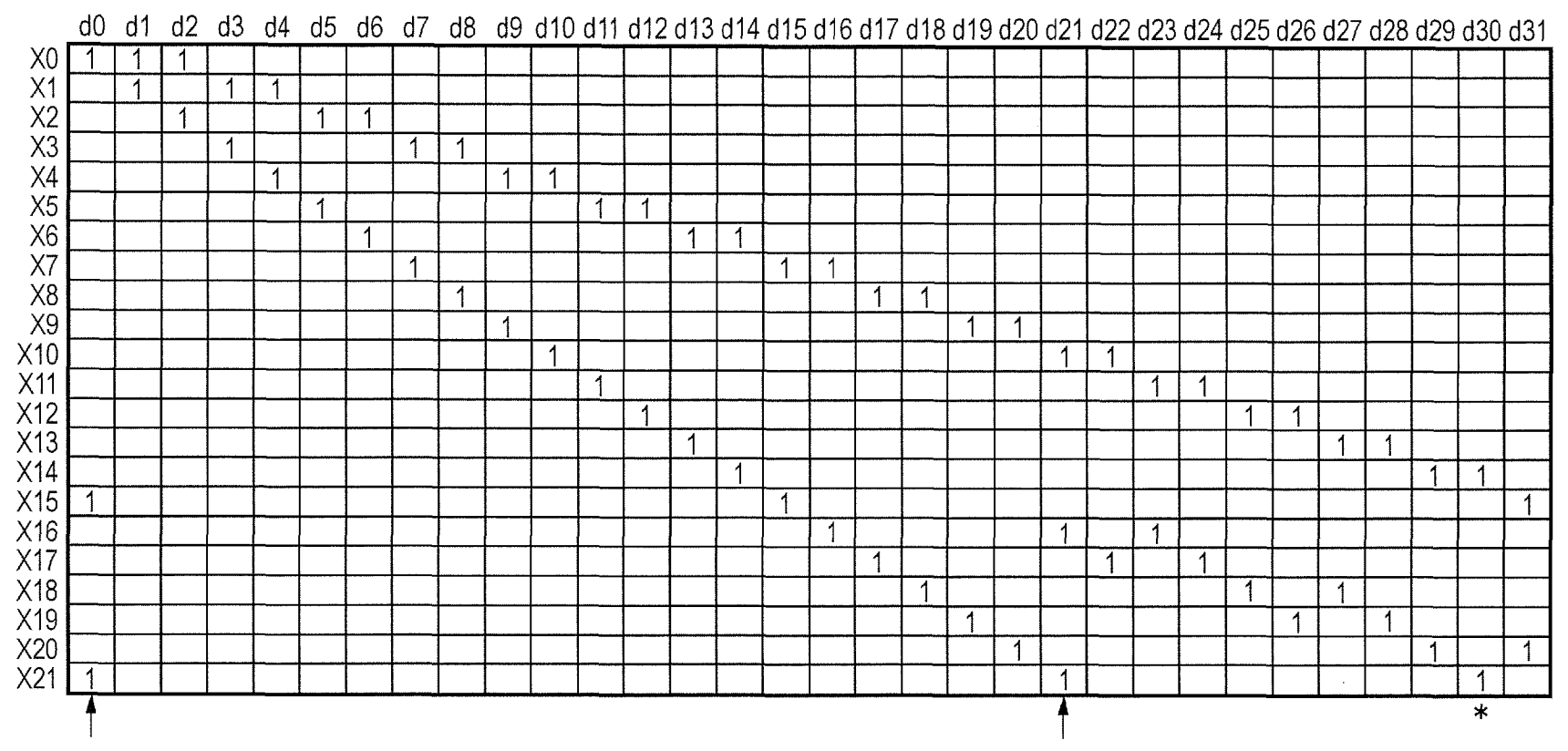
Figure 23:
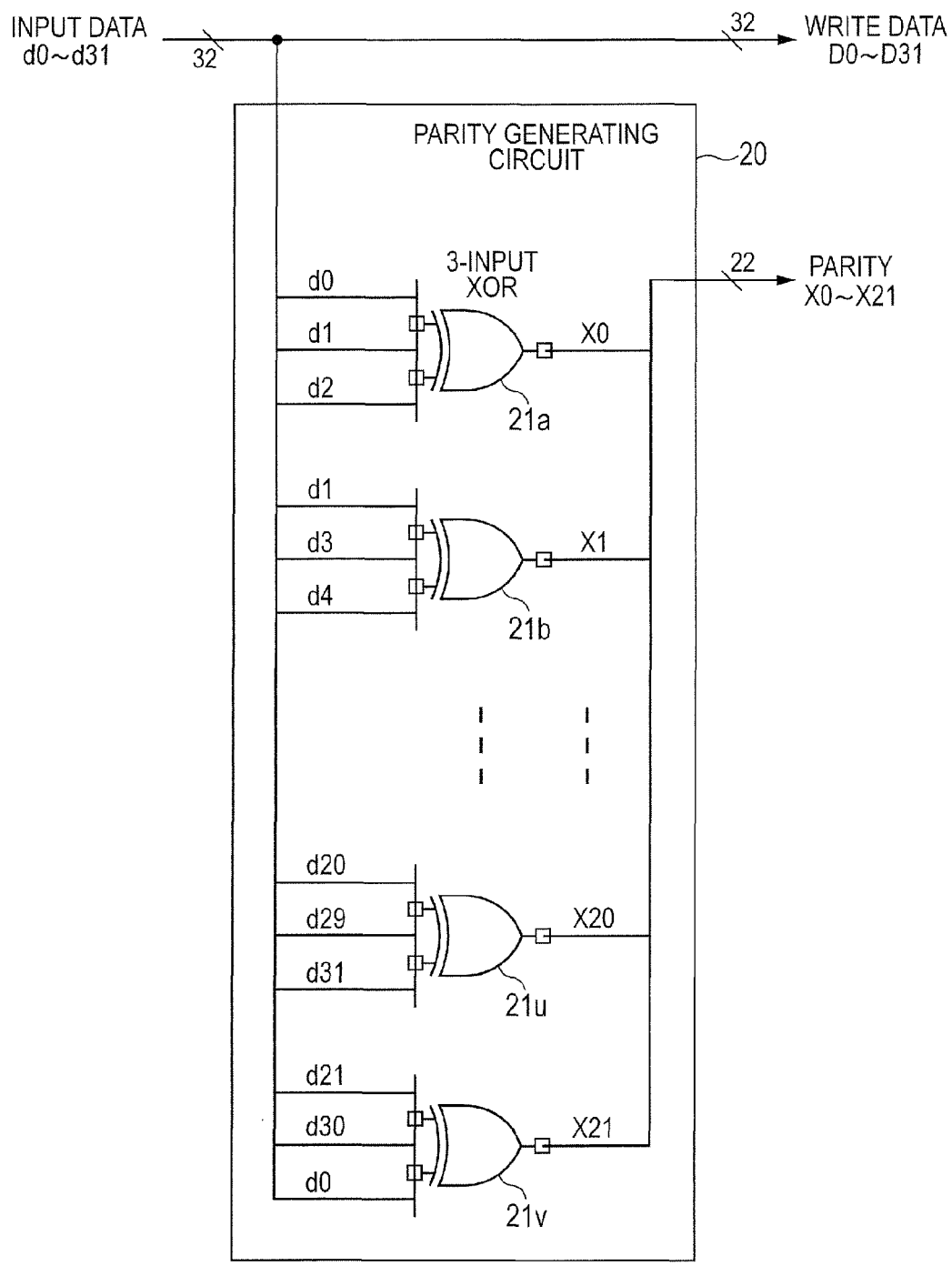
FIG. 23 is a block diagram of a parity generating circuit corresponding to a generator matrix of the parity of FIG. 22.

FIG. 22 illustrates another example of a parity generator matrix. Total 22 kinds of parities are provided so as to generate a parity from any three bits in the input data d0 to d31. The point that any bit in the input data d0 to d31 is covered with two kinds of parities is the same as that of the first embodiment. However, since the parity X21 for covering the column d30 indicated by "*" below the generator matrix by two kinds of parities is provided, each of only two columns (concretely, columns d0 and d21) indicated by up-pointing arrows below the generator matrix is covered with three kinds of parities. FIG. 23 is a block diagram of the parity generating circuit 20. In FIG. 23, the parity generating circuit 20 includes 22 pieces of 3-input XOR circuits 21a to 21v. A parity check circuit (not illustrated) corresponding to the circuit includes 22 pieces of 4-input XOR circuits and one 22-input AND circuit with INV.

Figure 24:
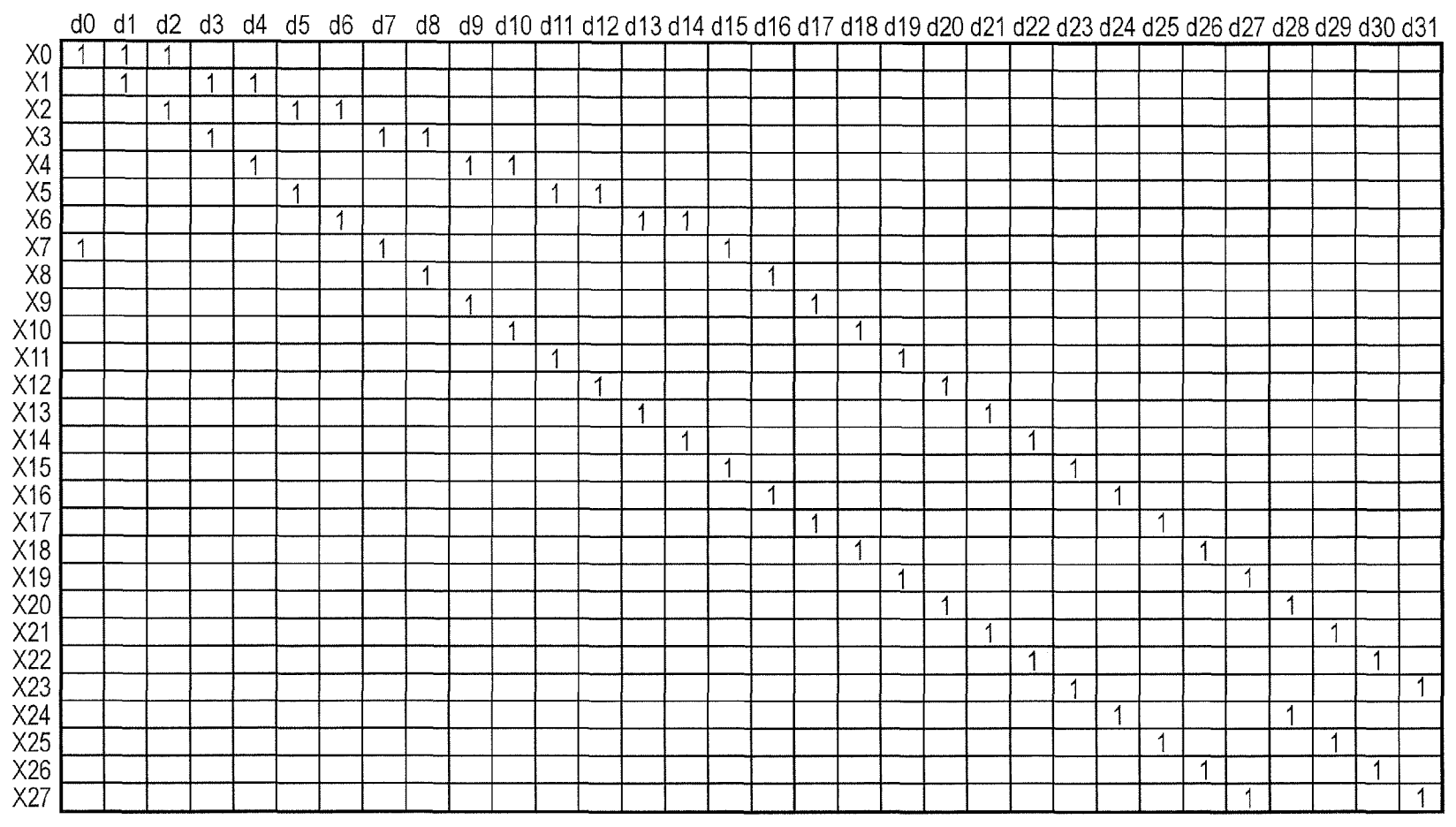

FIG. 24 illustrates further another example of the parity generator matrix for providing total 28 kinds of parities by generating each of the parities from any three or two bits in the input data d0 to d31. Each of bits of the input data d0 to d31 is covered with two kinds of parities. A parity generating circuit (not illustrated) includes eight 3-input XOR circuits and 20 pieces of 2-input XOR circuits. A parity check circuit (not illustrated) corresponding to the circuit includes eight 4-input XOR circuits, 20 pieces of 3-input XOR circuits, and one 28-input AND circuit with INV.

Figure 25:
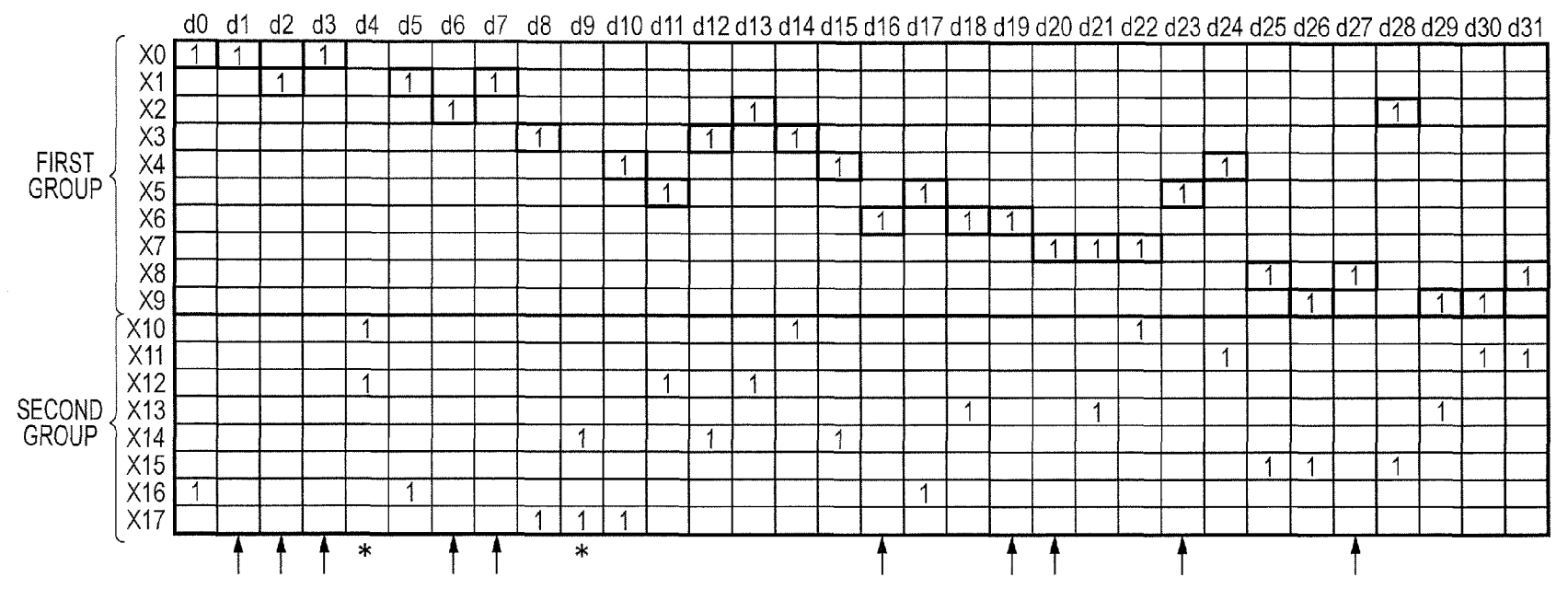
Figure 26:
FIG. 26 is an explanatory diagram illustrating the idea of a configuration of a generator matrix of the parity shown in FIG. 25.

FIG. 25 illustrates further another example of the parity generator matrix for generating a parity from any three bits in the input data d0 to d31 and 7-bit ECCs D0 to E6 are generated using total 18 kinds of parities generated as partial sums. It is based on the same idea as that of the second and third embodiments, and the idea is illustrated in FIG. 26. In the positions of the element "1" in the ECC generator matrix illustrated in FIG. 3, the symbols X0 to X17 indicating the 18 kinds of parities X0 to X17 used by the bits of input data corresponding to the positions are written. Three of each of X0 to X9 as the first group are included in any two rows in the rows E0 to E6. Three of each of X10 to X17 as the second group are included in any one row in the rows E0 to E6. As an exception, 12 elements (the row E4 and column d1 surround by a circle, and the like) in the generator matrix remain "1" as the original value.

It is understood from FIG. 26 that ECCs E0 to E6 can be generated by using the parities X0 to X17 as partial sums. FIG. 27 illustrates a state of the generation of ECCs in the form of a matrix in an ECC circuit (not illustrated). It is easily understood that the matrix of FIG. 27 is arranged on the side of the parity generator matrix illustrated in FIG. 25. Accordingly, the ECC circuit (not illustrated) includes five 6-input XOR circuits and two 5-input XOR circuits. A parity generating circuit (not illustrated) includes 18 pieces of 3-input XOR circuits, and a parity check circuit (not illustrated) includes 18 pieces of 4-input XOR circuits and one 18-input AND circuit with INV.

In each of the foregoing embodiments, relatively large kinds of parities such as 32 kinds, 28 kinds, 25 kinds, 24 kinds, 22 kinds or 18 kinds are generated from the small number of bits such as two bits or three bits in input data and used. Since the XOR circuit at the first stage in a parity check circuit can be configured by an XOR circuit with the small number of inputs such as three to four inputs, priority is given to shortening of the process delay time. Usually, the process delay time of an AND circuit with INV having large number of inputs such as 32 to 18 inputs in the post stage is not dominant, so that the way of thinking is suitable to increase the speed of a check with a parity. Although it is important to shorten the process delay time of a parity check circuit, it is also important to decrease the capacity of a TCM (high-speed memory) holding parities by decreasing the kinds of parities as much as possible, and there is the case where priority is demanded to be given to the latter one. To address the demand, while covering each of bits of input data with two or more kinds of parities, the number of kinds of parities has to be minimized.

Figure 28:
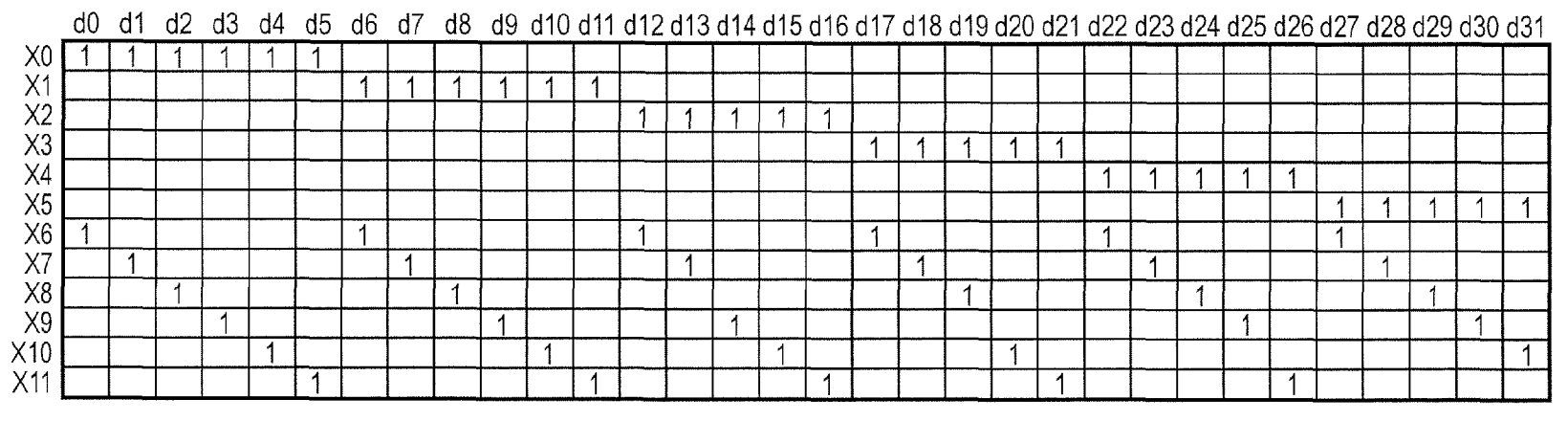

FIG. 28 illustrates an example of a parity generator matrix realizing the above. In the example, 12 kinds of parities are generated from any six or five bits in the input data d0 to d31. FIG. 29 illustrates the idea of configuring a parity generator matrix. On a precondition of covering each of bits in input data of 32 bits with two kinds of parities, an idea of covering each bit with a horizontal parity and a vertical parity is employed. Each of bits of input data is covered with two kinds of parities by arranging the input data d0 to d31 in a two-dimensional array of m rows by n columns, generating a horizontal parity from a plurality of bits arranged in each row, and generating a vertical parity from a plurality of bits arranged in each column.

Since the input data is made of 32 bits, the relation $m \times n \geq 32$ has to be satisfied. The number of kinds of parities each obtained by combining a horizontal parity and a vertical parity is (m+n) kinds. Total combinations of possible valid m and n are the following five ways. When m=2 and n=16 (m×n=32), the number of kinds of parities is 18. When m=3 and n=11 (m×n=33), the number of kinds of parities is 14. When m=4 and n=8 (m×n=32), the number of kinds of parities is 12. When m=5 and n=7 (m×n=35), the number of kinds of parities is 12. When m=6 and n=6 (m×n=36), the number of kinds of parities is 12. There are three combinations in which the number of kinds of parities is the 12 kinds as the minimum number. Since it is also important to generate each parity from the number of bits as small as possible, the combination m=6 and n=6 (m×n=36) is considered to be optimum. The two-dimensional array illustrated in FIG. 29 is obtained by arranging the input data d0 to d31 in six rows by six columns in a form corresponding to the combination. Since no bit in the input data is allocated to four elements out of 36 elements of the two-dimensional array, the positions of the elements are blank. From FIG. 29, six kinds of horizontal parities X0 to X5 each generated from six or five bits and six kinds of vertical parities X6 to X11 each generated from six or five bits can be configured. FIG. 28 illustrates it in the form of a parity generator matrix. In such a manner, the number of kinds of parities can be minimized.

The above-described idea of minimizing the kinds of parities is realized by covering each of bits of input data with two kinds of parities on precondition that a TCM (high-speed memory) is configured by a single memory. A similar idea can be applied also to the precondition that, like in the third embodiment, a TCM (high-speed memory) is configured by two memories, data of 32 bits is held in one of the memories, and an ECC and a parity accompanying the data are held in the other memory.

Figure 30:
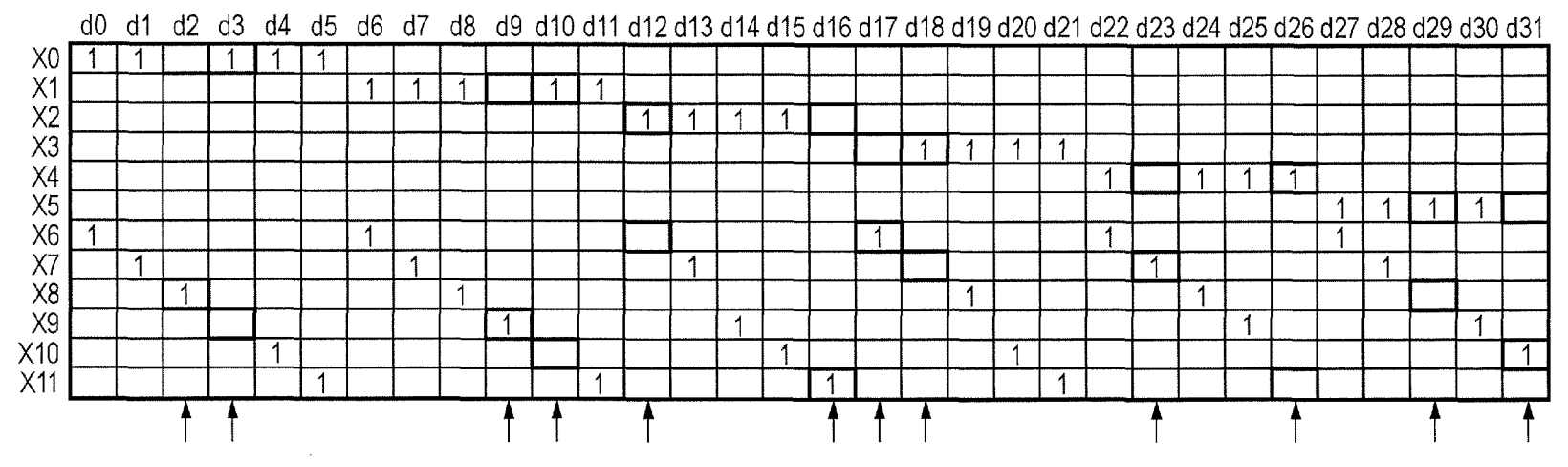

FIG. 30 illustrates an example of a parity generator matrix realizing the idea. Proper one of the elements "1" in the bit positions included in any of the rows X0 to X11 in the parity generator matrix illustrated in FIG. 28 is changed to blank so that each of only bits indicated by up-pointing arrows below the generator matrix is covered with only one kind of parity. FIG. 31 illustrates the idea of configuring the parity generator matrix in such a manner. Since there are six kinds of horizontal parities and six kinds of vertical parities, it is considered to be optimum to decrease the number of bits of input data used for generating a parity bit by bit for all of the parities. Consequently, although the two-dimensional array looks the same as that illustrated in FIG. 29, each of bits of input data allocated to the elements indicated by the thick frame lines in the two-dimensional array of FIG. 31 is made contribute to either the horizontal parity or the vertical parity. One bit contributed to a parity is decreased from each of the rows and the columns in the two-dimensional array. FIG. 30 illustrates the array in the form of a parity generator matrix. Although there are bits of input data each of which is covered with only one kind of parity, all of the other bits used to generate the parity are covered with the other kinds of parities, so that a 2-bit error cannot be missed.

Although the ECC generator matrix (G) illustrated in FIG. 3 and the ECC check matrix (H) illustrated in FIG. 8 are used in each of the foregoing embodiments, the invention can be similarly applied even to the case of using a generator matrix and a check matrix different from them. "1" may be added to a proper position (for example, the position of d24) in the rows E5 and E6 in FIG. 3 so that 14 pieces of "1" are included in each of all of the rows of the ECC generator matrix.

The invention can be also applied even to the case of inverting the value of any of bits in the input data d0 to d31 and, after that, generating an ECC. After inverting the value of any (for example, d0 and d1) of bits in input data corresponding to columns of an ECC generator matrix, the ECC generator matrix may be used. In this case, it is sufficient to use an ECC check matrix in a corresponding manner.

As illustrated in FIG. 13, in the third embodiment, the TCM (high-speed memory) is configured by two memories; the memory 29a holding data of 32 bits (write data and read data) itself to be processed by the CPU core 30, and the memory 29b holding ECCs of seven bits and parities of 25 bits (total 32 bits) accompanying the data. To cover the process delay time until the ECCs E0 to E6 are generated by the ECC generating circuit 15 in the parity/ECC encoder circuit 13, the timing may be adjusted by delaying a CLK signal to be given to the latter TCM 29b. Since it is sufficient to complete the process of the ECC decoder circuit 41 in the parity/ECC decoder circuit 22 within two clock cycles, there is enough time. However, it is to be noted that the processes in the parity check circuit 23 and the wait control circuit 19 in the parity/ECC decoder circuit 22 have to be completed in one clock cycle.

The present invention achieved by the inventors herein has been concretely described on the basis of the embodiments. Obviously, the present invention, however, is not limited to the embodiments but can be variously changed without departing from the gist.

For example, the data processing apparatus 100 of the MCU system 90 or the like may be configured by an integrated circuit (LSI: Large Scale Integrated circuit) formed on a single semiconductor substrate. The CPU core 30 may be a processor of any architecture or may be changed to another bus master device (for example, a direct memory access controller) accessing a memory or a cache controller.

For example, the logic circuit illustrated is just an example and can be changed to another circuit capable of executing equivalent logic operation. Positive logic or negative logic may be arbitrarily employed.

What is claimed is:

1. A data processing apparatus comprising:
  a processor;
  a memory;
  a parity/ECC encoder circuit disposed in a signal path for writing write data of a plurality of bits from the processor to the memory and including a parity generating circuit; and
  a parity/ECC decoder circuit disposed in a signal path for reading read data from the memory to the processor and including a parity check unit,
  wherein the parity generating circuit generates a parity comprising a plurality of parity bits from the write data and writes the parity together with the write data into the memory, each of the bits configuring the write data is configured to contribute to generation of at least two parity bits in the parity, and
  wherein the parity check unit is configured so as to be able to detect presence/absence of an error of one bit or two bits in the read data and the parity of the bits read from the memory.

2. The data processing apparatus according to claim 1,
  wherein the parity/ECC encoder circuit comprises an ECC generating circuit adding an error correction code capable of performing 1-bit error correction to the write data, the parity/ECC decoder circuit comprising an error correcting unit executing an error correcting process of correcting an error in the read data on the basis of the read data and an error correction code corresponding to the read data, and
  wherein the parity/ECC decoder circuit is configured, when the presence of an error is detected by the parity check unit, so as to be able to supply a wait signal to make the processor wait for reception of the read data until the error correcting process is completed.

3. The data processing apparatus according to claim 2, wherein the processor stalls a pipeline operation on the basis of the wait signal.

4. The data processing apparatus according to claim 2, wherein a process of detecting the presence/absence of an error by the parity check unit and the error correcting process by the error correcting unit are executed in parallel.

5. The data processing apparatus according to claim 2, wherein the error correcting unit is configured so as to be able to determine whether the number of bits of an error in the read data is one bit or two bits, when the number of bits of the error is one bit, executes the error correcting process and, when the number of bits of the error is two bits, notifies the processor of the fact that error correction is impossible.

6. The data processing apparatus according to claim 5, wherein the notification of the fact that the error correction is impossible is an interrupt request to the processor.

7. The data processing apparatus according to claim 1, wherein the parity generating circuit generates each of the parity bits by two bits or three bits in the write data.

8. The data processing apparatus according to claim 7, wherein the parity generating circuit includes an exclusive OR gate generating each parity of the bits from two bits or three bits in the write data.

9. The data processing apparatus according to claim 1,
  wherein the parity/ECC encoder circuit has an ECC generating circuit adding an error correction code capable of correcting an error of one bit to the write data, the parity/ECC decoder circuit comprising an error correcting unit executing an error correcting process of correcting an error in the read data on the basis of the read data and an error correction code corresponding to the read data, and
  wherein the ECC generating circuit is configured to be able to generate the error correction code by using, as a partial sum, the parity bits generated by the parity generating circuit from the write data to be written in the memory.

10. The data processing apparatus according to claim 1, wherein the memory includes a first memory into which the write data is written and a second memory into which the parity is written.

11. The data processing apparatus according to claim 1, wherein the parity generating circuit provides the parity so as to cover each of the bits of the write data by at least two kinds of the parity.

12. The data processing apparatus according to claim 1, wherein the parity generating circuit provides the parity so as to cover each of the bits of the write data by a plurality of kinds of the parity, and
  wherein the parity generating circuit includes an exclusive OR gate generating each parity of the bits from at least two bits in the write data.

13. A data processing apparatus comprising:
  a processor;
  a memory;
  a parity generating circuit disposed in a signal path for writing write data of a plurality of bits from the processor to the memory; and
  a parity check unit disposed in a signal path for reading read data from the memory to the processor,
  wherein the parity generating circuit generates a parity comprising a plurality of parity bits from the write data and writes the parity together with the write data into the memory, and each of the bits configuring the write data is configured to contribute to generation of at least two parity bits in the parity, and
  wherein the parity check unit is configured so as to be able to detect the presence/absence of an error of one bit or two bits in the read data and the parity of the bits read from the memory.

14. The data processing apparatus according to claim 13, further comprising a main storage device,
  wherein the memory is a cache memory of reading data from the main storage device and temporarily storing the data, and
  wherein the parity check unit is configured to be able to detect the presence/absence of an error in read data which is read from the cache memory and, in the case of the presence of an error, reads data corresponding to the read data from the main storage device and rewrites it in the cache memory.

15. The data processing apparatus according to claim 14, wherein the main storage device is a nonvolatile memory.

16. The data processing apparatus according to claim 13, wherein the parity generating circuit provides the parity so as to cover each of the bits of the write data by at least two kinds of the parity.

17. A data processing apparatus comprising:
  a processor;
  a memory;

a first circuit which is disposed in a signal path for writing write data of plurality of bits from the processor to the memory and which includes a parity generating circuit and an Error Correction Code (ECC) generating circuit; and a second circuit which is disposed in a signal path for reading read data from the memory to the processor and which includes a parity check circuit and an ECC decoder circuit, wherein the parity generating circuit generates a parity comprising a plurality of parity bits from the write data, wherein each of the bits configuring the write data is configured to contribute to generation of at least two parity bits in the parity, wherein the ECC generating circuit generates an ECC from the write data, the ECC being capable of performing one bit error correction and two bit error detection, wherein the parity and the ECC are written together with the write data into the memory, wherein the parity check circuit detects a presence/absence of an error of one bit or two bits in the read data and the parity read from the memory to generate a first error signal, and wherein the ECC decoder circuit, when the first error signal indicative of the presence of the error is output from the parity check circuit, outputs the read data in which one bit error correction is executed or a second error signal indicating that two bits error is detected in the read data on the basis of the read data and the ECC read from the memory.

18. The data processing apparatus according to claim 17, wherein the second circuit further comprises a wait control circuit which generates a wait signal in response to the first error signal indicative of the presence of the error, and wherein the processor stalls a pipeline operation on the basis of the wait signal.

19. The data processing apparatus according to claim 17, wherein the second circuit further comprises a data switching circuit which outputs either the read data or the read data in which one bit error correction is executed, and wherein the data switching circuit selects the read data in which one bit error correction is executed in response to a signal corresponding to the first error signal indicative of the presence of the error.

20. The data processing apparatus according to claim 17, wherein the parity generating circuit provides the parity so as to cover each of the bits of the write data by at least two kinds of the parity.

* * * * *